(12) United States Patent
Waterworth et al.

(10) Patent No.: US 9,349,643 B2
(45) Date of Patent: May 24, 2016

(54) APPARATUS AND METHOD FOR THIN WAFER TRANSFER

(71) Applicant: Brewer Science Inc., Rolla, MO (US)

(72) Inventors: Blake Waterworth, Springfield, MO (US); Steven Matthew Rich, Rolla, MO (US); Molly Hladik, Rolla, MO (US); Kirk Emory, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 160 days.

(21) Appl. No.: 14/229,310

(22) Filed: Mar. 28, 2014

(65) Prior Publication Data

US 2014/0295656 A1  Oct. 2, 2014

Related U.S. Application Data

(60) Provisional application No. 61/807,121, filed on Apr. 1, 2013.

(51) Int. Cl.
  *H01L 21/687* (2006.01)
  *H01L 21/673* (2006.01)
  (Continued)

(52) U.S. Cl.
  CPC .... *H01L 21/76898* (2013.01); *H01L 21/68707* (2013.01); *H01L 21/68714* (2013.01);
  (Continued)

(58) Field of Classification Search
  CPC .................. H01L 21/68707; H01L 21/68757; H01L 21/76898; H01L 21/68714; H01L 21/68785; Y10T 156/11; Y10T 156/19; Y10T 156/18; Y10T 156/1744

USPC .......... 156/285, 289, 579, 701, 750; 438/585, 438/666, 689, 693
See application file for complete search history.

(56) References Cited

U.S. PATENT DOCUMENTS 5,647,626 A * 7/1997 Chen ................. H01L 21/68707
  294/213
6,167,322 A * 12/2000 Holbrooks ........ H01L 21/67259
  294/103.1

(Continued)

FOREIGN PATENT DOCUMENTS

| EP | 1 858 058 A1 | 11/2007 |
| JP | 2009-105116 | 5/2009 |
| WO | 00/68977 A1 | 11/2000 |

OTHER PUBLICATIONS

Written Opinion of PCT/US2014/032226.*
(Continued)

*Primary Examiner* — Sonya Mazumdar
(74) *Attorney, Agent, or Firm* — Hovey Williams LLP

(57) ABSTRACT

A wafer transfer assembly and method of using the assembly to transfer device wafers between processing tools in a manufacturing process are described herein. The assembly comprises a wafer transfer disk, an end effector configured to receive and support the wafer transfer disk, and an elongated handle extending from the end effector. The wafer transfer disk comprises a wafer-engaging surface configured to support a debonded device wafer placed on the wafer transfer assembly with the device surface adjacent the wafer-engaging surface. The wafer-engaging surface has non-stick properties, and yields a low bonding strength interface between the wafer-engaging surface and device surface. The resulting transfer stack can be transported to other processing tools for additional processing of the debonded device wafer, followed by separating the debonded device wafer and the wafer transfer disk without damaging the device wafer.

24 Claims, 16 Drawing Sheets

(51) Int. Cl.
*H01L 21/683* (2006.01)
*B32B 37/14* (2006.01)
*B32B 38/18* (2006.01)
*H01L 21/768* (2006.01)
*B32B 37/26* (2006.01)

(52) U.S. Cl.
CPC .... *H01L21/68757* (2013.01); *H01L 21/68785* (2013.01); *Y10T 156/11* (2015.01); *Y10T 156/1744* (2015.01); *Y10T 156/18* (2015.01); *Y10T 156/19* (2015.01)

(56) References Cited

U.S. PATENT DOCUMENTS

| | | | | |
|---|---|---|---|---|
| 6,467,827 | B1* | 10/2002 | Ardezzone | H01L 21/67259 294/119.3 |
| 2003/0173790 | A1* | 9/2003 | Hartog | H01L 21/67383 294/183 |
| 2003/0180125 | A1* | 9/2003 | van den Berg et al. | H01L 21/67098 414/172 |
| 2003/0234548 | A1 | 12/2003 | Aggarwal | |
| 2004/0145199 | A1* | 7/2004 | Haas | G11B 17/04 294/64.3 |
| 2005/0052041 | A1* | 3/2005 | Bonora | H01L 21/6838 294/188 |
| 2006/0157998 | A1* | 7/2006 | Gershenzon | H01L 21/68707 294/103.1 |
| 2007/0185310 | A1 | 8/2007 | Moore et al. | |
| 2008/0173970 | A1 | 7/2008 | Pillalamarri | |
| 2009/0038750 | A1 | 2/2009 | Hong et al. | |
| 2010/0112305 | A1 | 5/2010 | Hong et al. | |
| 2011/0014774 | A1 | 1/2011 | Johnson et al. | |
| 2013/0201635 | A1 | 8/2013 | Xu | |

OTHER PUBLICATIONS

International Search Report and Written Opinion mailed Jul. 1, 2014 in corresponding PCT/US2014/032226 filed Mar. 28, 2014.

\* cited by examiner

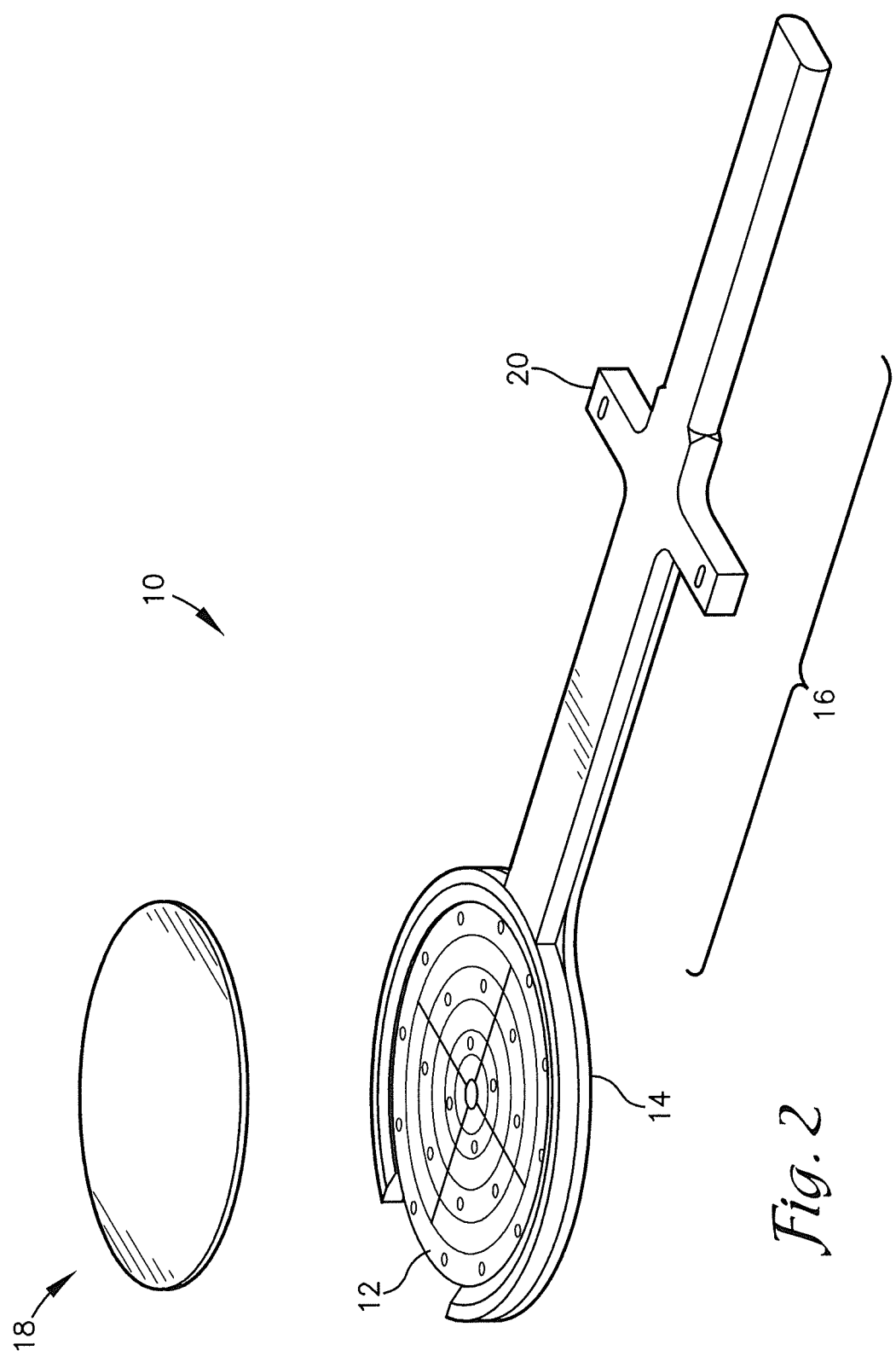

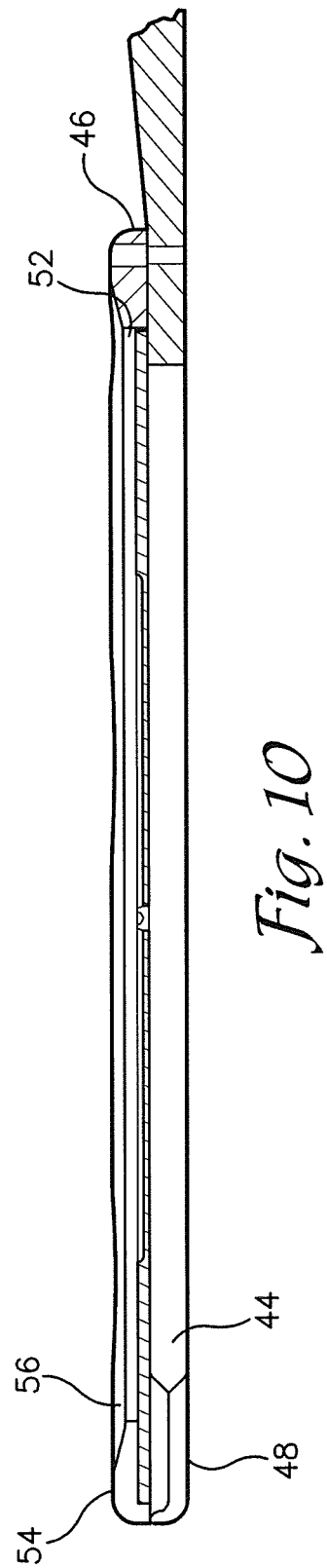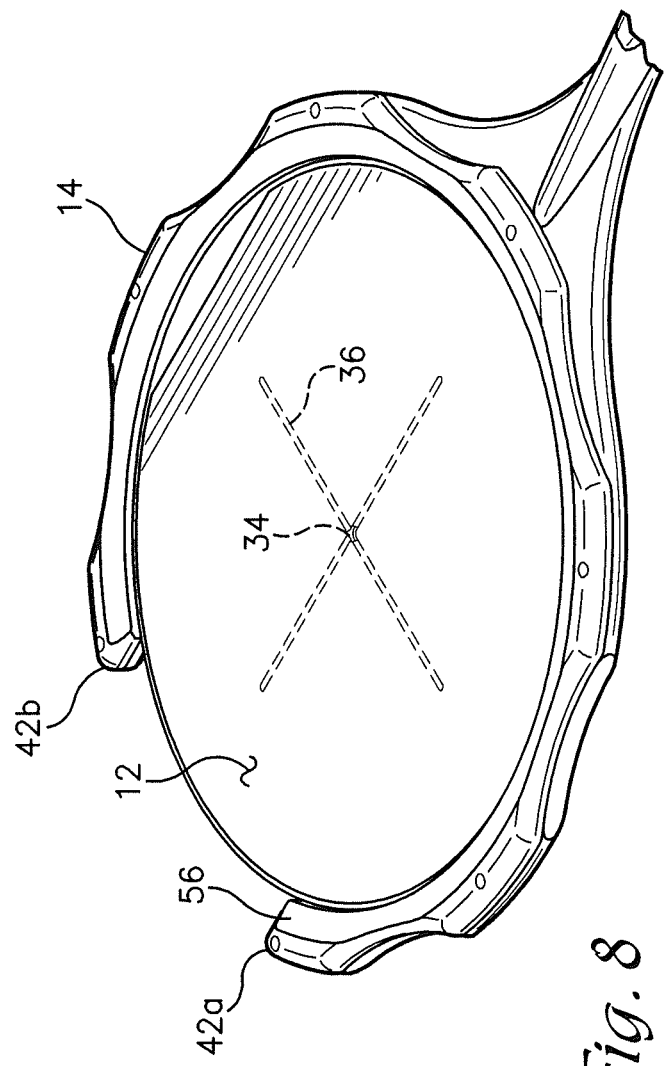

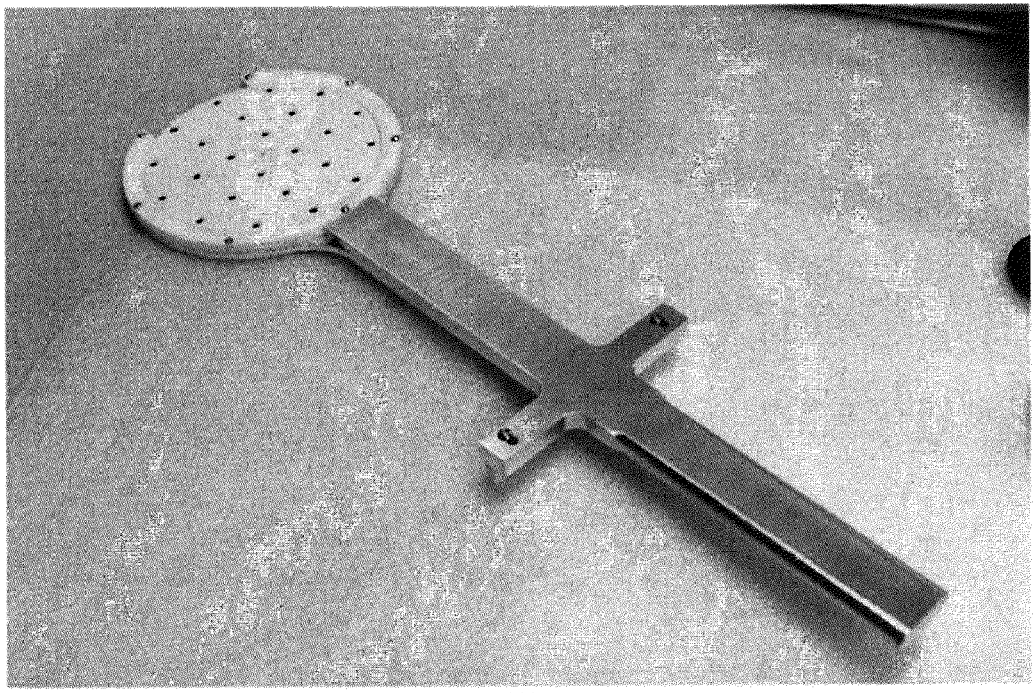
(A)
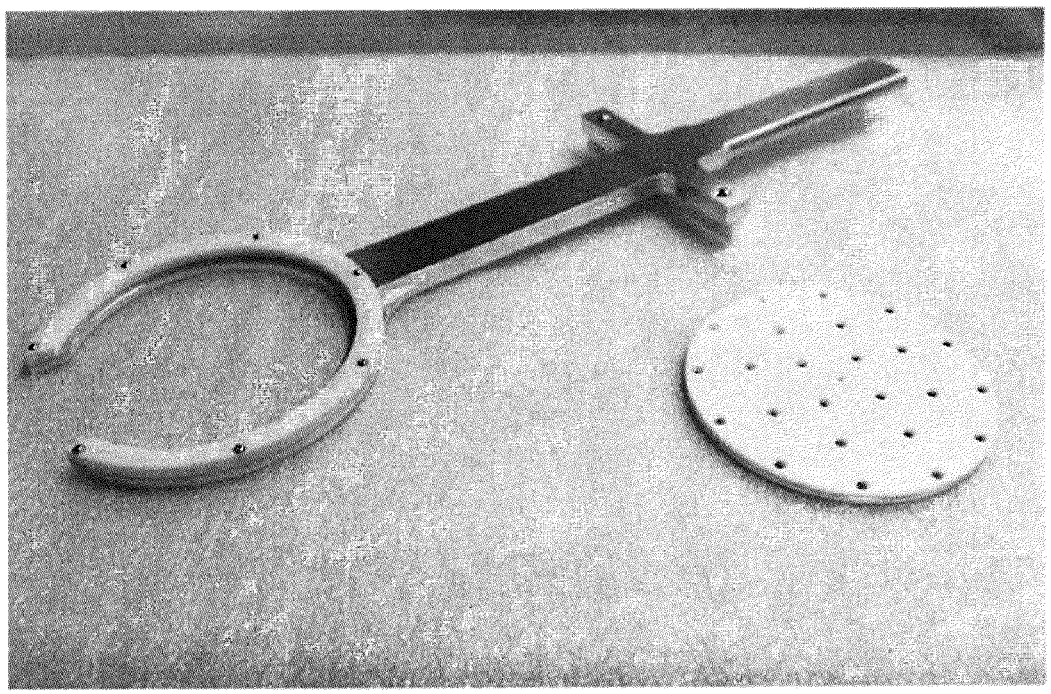
(B)
Fig. 13

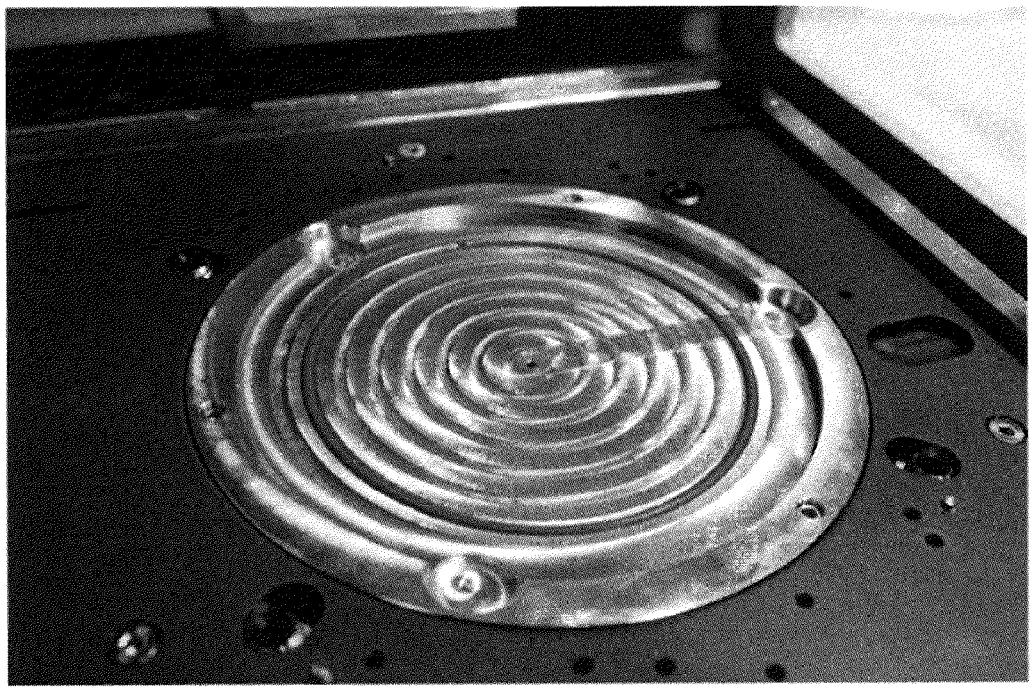
(A)
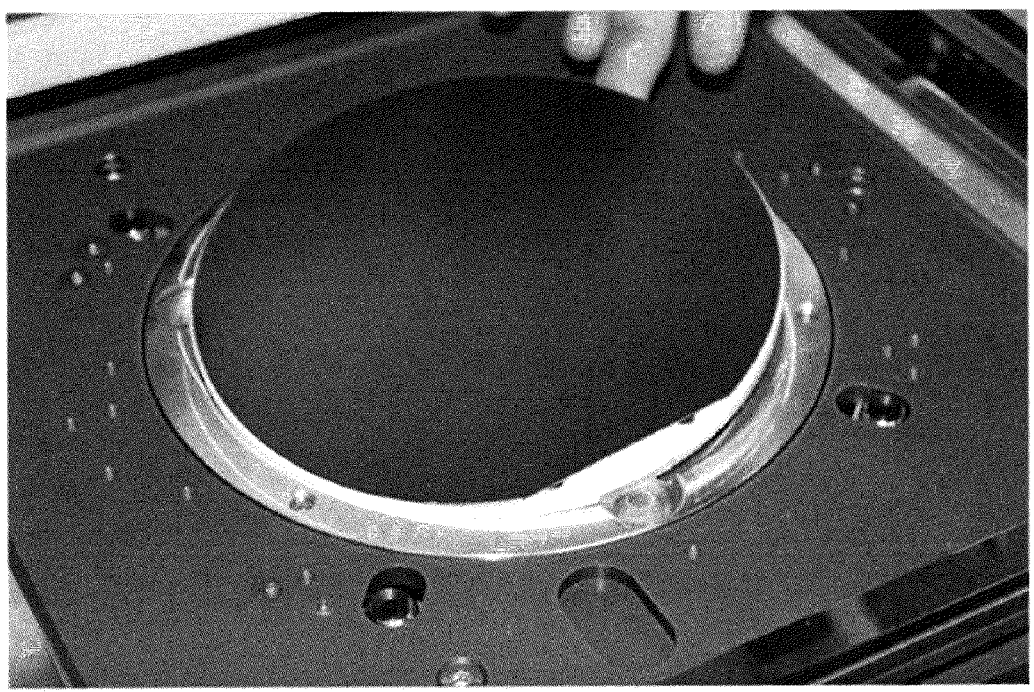
(B)
Fig. 18

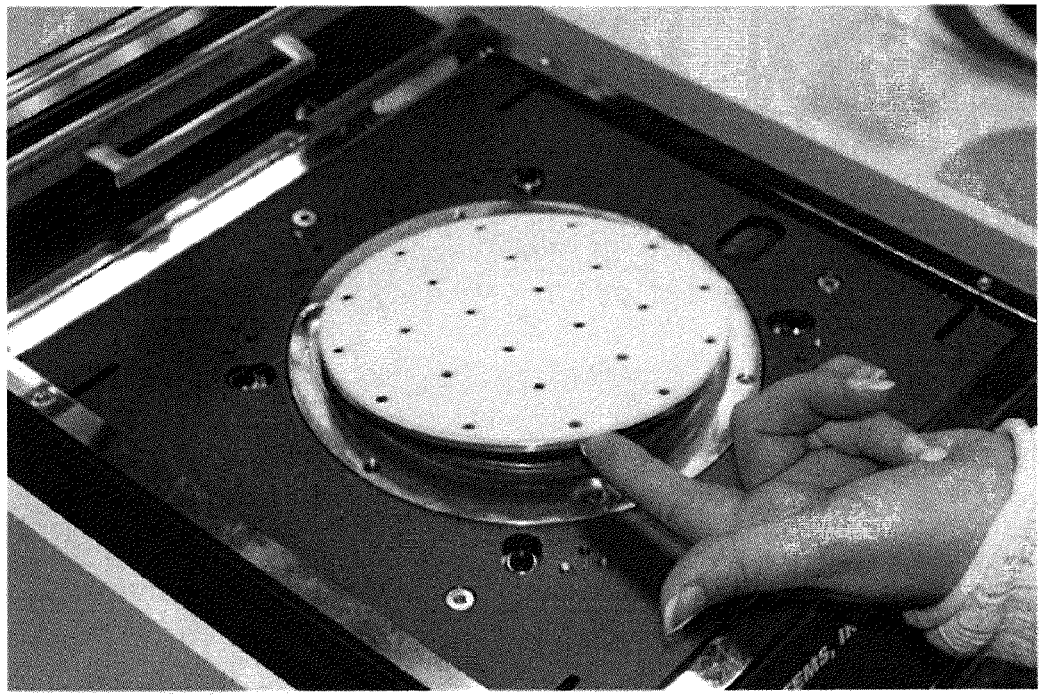
(A)
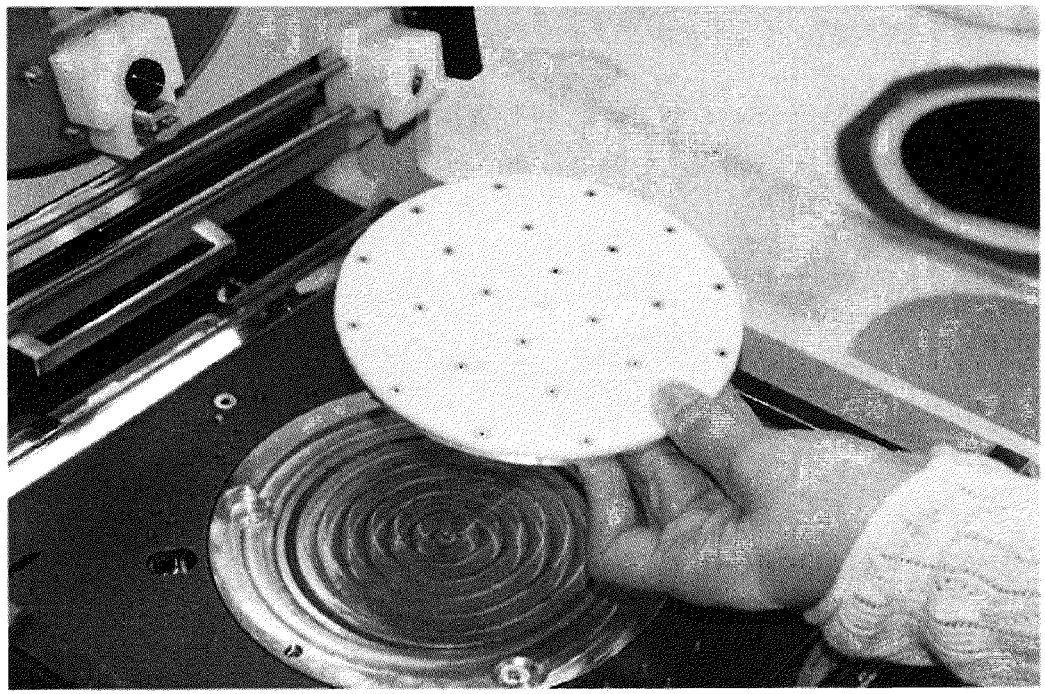
(B)
Fig. 21

APPARATUS AND METHOD FOR THIN WAFER TRANSFER

CROSS-REFERENCE TO RELATED APPLICATIONS

The present application claims the priority benefit of U.S. Provisional Patent Application Ser. No. 61/807,121, filed Apr. 1, 2013, entitled APPARATUS AND METHOD FOR THIN WAFER TRANSFER, incorporated by reference in its entirety herein.

BACKGROUND OF THE INVENTION

1. Field of the Invention

The present invention relates to methods and devices for transferring thin wafers during semiconductor wafer processing.

2. Description of Related Art

Integrated circuits, power semiconductors, light-emitting diodes, photonic circuits, microelectromechanical systems (MEMS), embedded passive arrays, packaging interposers, and a host of other silicon- and compound semiconductor-based microdevices are produced collectively in arrays on wafer substrates ranging from 1 to more than 12 inches in diameter. The devices are then separated into individual devices or dies that are packaged to allow practical interfacing with the macroscopic environment, for example, by interconnection with a printed wiring board. Constructing the device package on or around the die while it is still part of the wafer array has become increasingly popular. This practice, which is referred to as wafer-level packaging, reduces overall packaging costs and allows a higher interconnection density to be achieved between the device and its microelectronic environment than with more traditional packages that usually have outside dimensions several times larger than the actual device.

Until recently, interconnection schemes have generally been confined to two dimensions, meaning the electrical connections between the device and the corresponding board or packaging surface to which it is mounted have all been placed in a horizontal, or x-y, plane. The microelectronics industry has now recognized that significant increases in device interconnection density and corresponding reductions in signal delay (as a result of shortening the distance between electrical connection points) can be achieved by stacking and interconnecting devices vertically, that is, in the z-direction. Two common requirements for device stacking are (1) thinning of the device wafer in the through-wafer direction from the backside; and (2) subsequently forming through-wafer electrical connections, commonly referred to as through-silicon vias, or TSVs, that terminate on the backside of the device. Semiconductor device thinning has now become a standard practice even when devices are not packaged in a stacked configuration because such thinning facilitates heat dissipation and allows a much smaller form factor to be achieved with compact electronic products such as mobile phones.

There is growing interest in thinning semiconductor devices to thicknesses of less than 100 microns to reduce their profiles, especially when they or the corresponding packages in which they reside are stacked, and to simplify the formation of backside electrical connections on the devices. Silicon wafers used in high-volume integrated circuit production are typically 200 or 300 mm in diameter and have a through-wafer thickness of about 750 µm. Without thinning, it would be nearly impossible to form backside electrical contacts that connect with front-side circuitry by passing the connections through the wafer. Highly efficient thinning processes for semiconductor-grade silicon and compound semiconductors based on mechanical grinding (backgrinding) and polishing as well as chemical etching are now in commercial use. These processes allow the device wafer thickness to be reduced to less than 100 µm in a few minutes while maintaining precise control over cross-wafer thickness uniformity.

Device wafers that have been thinned to thicknesses of less than 100 µm, and especially those devices thinned to less than 60 µm, are extremely fragile and must be supported over their full dimensions to prevent cracking and breakage. An increasingly popular approach to ultrathin wafer handling involves mounting the full-thickness device wafer device-side-down to a rigid carrier with a polymeric adhesive, and the device wafer then is thinned and processed from the backside. The fully processed, ultrathin wafer is then removed, or debonded, from the carrier by thermal, thermomechanical, mechanical, or chemical processes after the backside processing has been completed.

After debonding the device or processed wafer from its carrier, especially by thermomechanical debonding, the device wafer must then be transferred to other tools for subsequent processing, such as lamination to a film frame. Multiple problems can arise during transfer, such as breakage, wafer bow, warping, and scratching. Additionally, the device wafer needs to be reliably centered on the transfer tool in order to ensure that it is placed repeatably for the next process.

Gel-Pak® brand transfer tools are a well-known method of handling device wafers. However, this method of handling requires manual removal of the device wafer before the next process as well as manual centering. Over time, a Gel-Pak® transfer tool may become dirty and is unable to be cleaned. This can cause uneven pressure and adhesion on the device and can cause breakage. Gel-Pak® tools are also tacky, which makes the removal of the device difficult. Additionally, Gel-Pak® tools can be damaged by the heat generated by thermomechanical debonding processes.

SUMMARY OF THE INVENTION

The present invention is broadly concerned with a method of transferring a device wafer in a manufacturing process. The method comprises providing a wafer transfer assembly and a debonded device wafer. The wafer transfer assembly comprises a wafer transfer disk, an end effector configured to receive and support the wafer transfer disk, and an elongated handle extending from the end effector. The wafer transfer disk is a substantially planar body comprising a wafer-engaging surface, an opposing back surface, and an outer edge defining the perimeter of the wafer transfer disk, wherein the wafer-engaging surface has non-stick properties. The device wafer comprises a device surface and a backside surface. The debonded device wafer is placed on the wafer transfer assembly with the device surface adjacent the wafer-engaging surface of the wafer transfer disk to yield a transfer stack, wherein the device surface has a low bonding strength interface with the wafer-engaging surface. The debonded device wafer and wafer transfer disk are then separated.

The combination of a wafer transfer assembly and a debonded device wafer is also described herein. The wafer transfer assembly comprises a wafer transfer disk, an end effector configured to receive and support the wafer transfer disk, and an elongated handle extending from the end effector. The wafer transfer disk is a substantially planar body comprising a wafer-engaging surface, an opposing back surface, and an outer edge defining the perimeter of the wafer transfer disk, wherein the wafer-engaging surface has non-stick properties.

The device wafer comprises a device surface and a backside surface. In the combination, the device surface is adjacent the wafer-engaging surface of the wafer transfer disk, wherein the device surface has a low bonding strength interface with the wafer-engaging surface.

A wafer transfer assembly is also described herein. The wafer transfer assembly comprises a wafer transfer disk, an end effector configured to receive and support the wafer transfer disk, and an elongated handle extending from the end effector. The wafer transfer disk is a substantially planar body comprising a wafer-engaging surface, an opposing back surface, and an outer edge defining the perimeter of the wafer transfer disk, wherein the wafer-engaging surface has non-stick properties. The end effector comprises a C-shaped body with a gap at one location resulting in two free ends. The C-shaped body comprises an annular interior sidewall, an opposing annular exterior sidewall, a bottom surface extending between the interior sidewall and exterior sidewall, a disk-engaging surface extending from the interior sidewall outwardly in substantially parallel alignment with the bottom surface, and terminating at a point that is spaced from the exterior sidewall. A disk-engaging sidewall extends from this point substantially perpendicularly from the disk-engaging surface in a direction away from bottom surface. The disk-engaging surface and disk-engaging sidewall cooperatively form a disk-receiving groove.

BRIEF DESCRIPTION OF THE DRAWINGS

FIG. 2 is a schematic drawing showing of an embodiment of the wafer transfer assembly, including the optional top disk;

FIG. 8 is an enlarged view of the end effector and wafer transfer disk of the assembly;

FIG. 10 is a cross-sectional view of the end effector taken along section line 3 in FIG. 7;

FIG. 13(A)-(B) are photographs of the prototype assembly used in the working example;

FIG. 18(A)-(B) are photographs from the working example showing (A) the laminator vacuum chuck, and (B) placement of the transfer stack into the laminator;

FIG. 21(A)-(B) are photographs from the working example showing removal of the transfer disk from the laminator chuck using simply finger pressure to lift the disk out of the tool.

Figure 1:
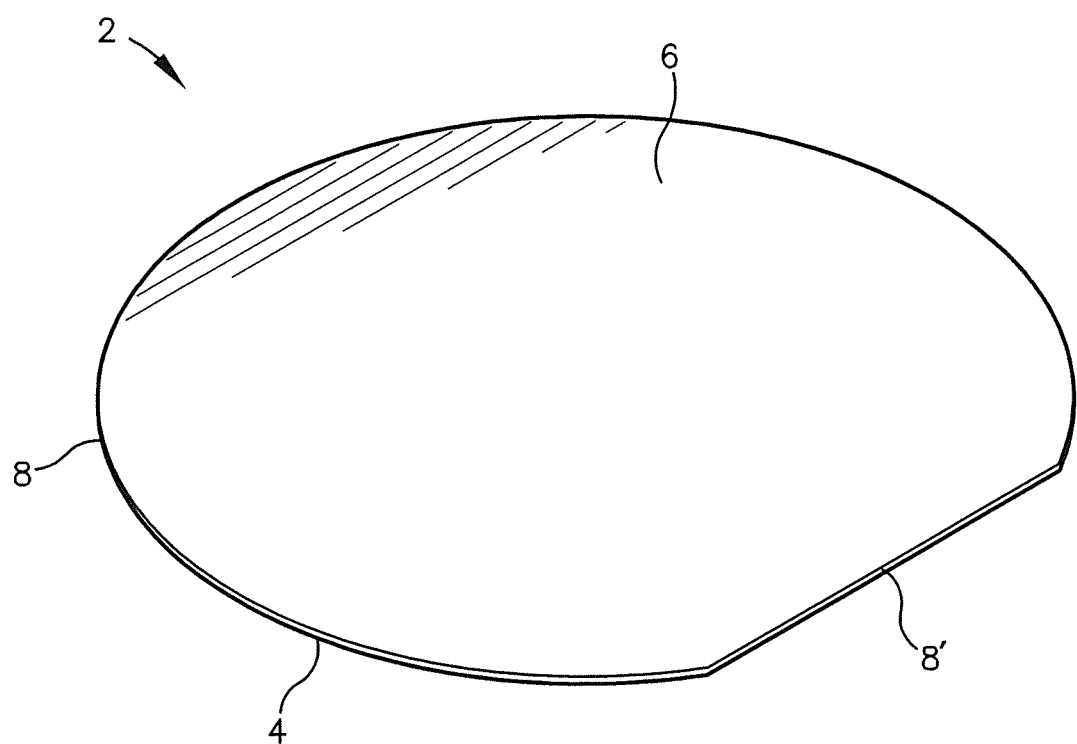
FIG. 1 is a schematic drawing of a device wafer.

While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing.

DETAILED DESCRIPTION OF PREFERRED EMBODIMENTS

The present invention is concerned with a method and assembly for transporting, handling, or otherwise transferring device wafers between processing points in the manufacturing process. The method and assembly is particularly suited for thin-wafer handling, transferring debonded device wafers, and/or handling wafers after backside processing.

In general, device wafers suitable for use in the invention include any microelectronic substrate. Preferred substrates include those selected from the group consisting of silicon, SiGe, ZnSe, $SiO_2$, $Si_3N_4$, aluminum, tungsten, tungsten silicide, gallium arsenide, germanium, tantalum, tantalum nitride, indium, and indium phosphide. The substrate can have a planar surface, or it can include topographic features (via holes, trenches, contact holes, raised features, lines, etc.). As used herein, "topography" refers to the height or depth of a structure in or on a substrate surface. Referring to FIG. 1, the device wafer 2 will comprise a device surface 4, a backside surface 6, and an outer edge 8 defining the perimeter of the wafer 2. The device wafer 2 may be of any shape (e.g., square, ellipsoid, etc.), but would typically be substantially circular in shape, and may include one or more wafer flats or notches 8'. Suitable device wafers include substrates with device surfaces 4 comprising arrays of devices selected from the group consisting of integrated circuits, MEMS, microsensors, power semiconductors, light-emitting diodes, photonic circuits, interposers, embedded passive devices, and other microdevices fabricated on or from silicon and other semi-conducting materials such as silicon-germanium, gallium arsenide, and gallium nitride. The surfaces of these devices commonly comprise structures formed from one or more of the following materials: silicon, polysilicon, silicon dioxide, silicon (oxy)nitride, metals (e.g., copper, aluminum, gold, tungsten, tantalum), low-k dielectrics, polymer dielectrics, and various metal nitrides and silicides. The device surface 4 can also include raised structures such as solder bumps and metal posts and pillars. It will be appreciated that in the context of this invention, the device surface 4 and backside surface 6 can be reversed in some embodiments.

The wafer device surface 4 needs to be protected during backside processing, such as backgrinding, TSV-formation processes, and other processes such as chemical-mechanical polishing (CMP), patterning (e.g., photolithography, via etching), etching, metal and dielectric deposition, passivation, annealing, and cleaning, because these steps impose high thermal and mechanical stresses on the device wafer as it is being thinned or after thinning. One approach, as noted above, is to temporarily support the device wafer on a carrier substrate, followed by debonding the processed device wafer from its carrier (not shown). Accordingly, the device surface 4 of the debonded device wafer 2 in the present methods will generally comprise various residual protective (cushioning) and/or adhesive materials, which are the materials remaining on the surface after the debonding procedure. Non-limiting examples of materials that may be on the device surface 4 of a debonded device wafer 2 include: spin-on polymeric adhesives; laminates; dry-film tapes; fill materials (e.g., cyclic olefin polymers and copolymers sold under the names APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont); commercial temporary wafer bonding compositions such as the WaferBOND®, Brewer-BOND™, and ZoneBOND® materials all available from Brewer Science Inc., Rolla, Mo.; photoresist compositions; high solids, UV-curable resin systems such as reactive epoxies and acrylics; two-part epoxies; silicone adhesives; thermoplastic acrylic, styrenic, vinyl halide (non-fluoro-containing), or vinyl ester polymers and copolymers; polyamides; polyimides; polysulfones; polyethersulfones; polyurethanes; cyclic olefins; polyolefin rubbers (e.g., polyisobutylene); waxes, and hydrocarbon-based tackifier resins. Exemplary bonding compositions are also described in U.S. Patent Publication Nos. 2007/0185310, 2008/0173970, 2009/0038750, and 2010/0112305, each incorporated by reference herein. Therefore, a "debonded device wafer," as used herein, refers to a device wafer that has been separated from a secondary substrate, such as a carrier wafer, vacuum chuck, and the like, and comprises a residual coating of protective, adhesive, and/or fill material adjacent at least a portion of the device surface 4. In one or more embodiments, the residual coating material has been heated or otherwise softened as part of the debonding process and may be tacky (i.e., slightly adhesive or sticky). In one or more embodiments, the debonded device wafer has been subjected to backside processing before being separated from the secondary substrate. In one or more embodiments, the debonded device wafer is a thinned wafer, with an average thickness of less than about 500 µm thick, more preferably less than about 200 µm, and even more preferably less than about 100 µm. The average thickness is defined as the average of 5 measurements across the wafer taken by an ellipsometer.

Referring to FIG. 2, a wafer transfer assembly 10 is provided, which is useful for transferring a debonded device wafer 2 between processing points in the manufacturing process. The wafer transfer assembly 10 comprises a wafer transfer disk 12, an end effector 14 for supporting the wafer transfer disk 12, and an elongated handle 16 extending from the end effector 14. In one or more embodiments, the wafer transfer assembly 10 may further comprise an optional top disk 18 and/or optional alignment indicator 20. The assembly 10 can be configured for manual use, or it may be used in automated handling, such as being attached via the handle 16 to a robot arm or other automated machinery.

Figure 3:
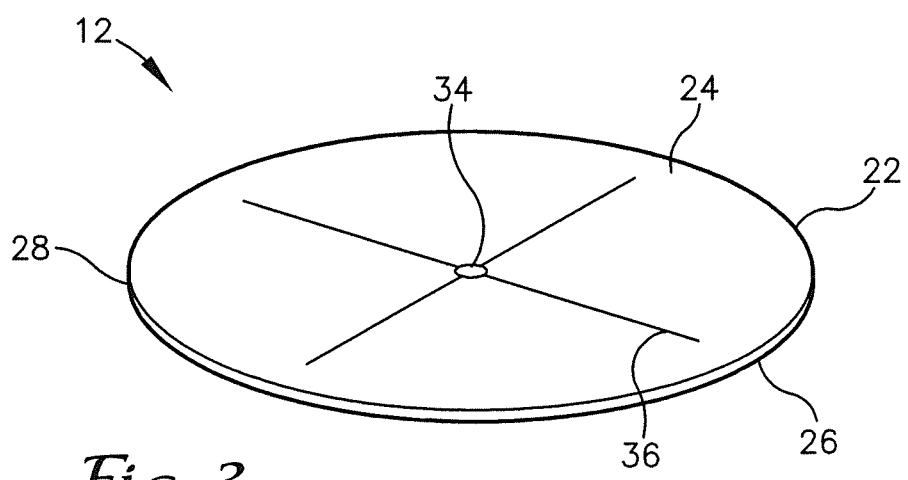
FIG. 3 is a schematic drawing showing of an embodiment of a wafer transfer disk.

Referring to FIG. 3, the wafer transfer disk 12 comprises a substantially planar body 22, including a wafer-engaging surface 24, an opposing back surface 26, and an outer edge 28 defining the perimeter of the wafer transfer disk 12. The wafer transfer disk 12 can be of any shape (e.g., square, ellipsoid, etc.), although it would typically be substantially circular in shape, and may optionally have at least one flat or notch (straight edge at the periphery, not shown). Furthermore, the wafer transfer disk 12 would preferably be sized to be approximately equal in size to the device wafer. In one or more embodiments, the wafer transfer disk 12 will have about the same diameter as the device wafer to be transferred. That is, a 200-mm wafer transfer disk 12 should be used to transfer a 200-mm device wafer, and a 150-mm wafer transfer disk 12 should be used to transfer a 150-mm device wafer. In one or more embodiments, the wafer transfer disk 12 has a diameter that is at least the size of the diameter of the device wafer, although the wafer transfer disk 12 may be slightly larger. Preferably, the diameter of the wafer transfer disk 12 is no more than about 10 mm larger than the diameter of the device wafer, more preferably it is no more than about 5 mm larger than the diameter of the device wafer, and even more preferably is no more than about 2 mm larger than the diameter of the device wafer. In one or more embodiments, the wafer transfer disk 12 has a diameter that is slightly smaller than the diameter of the device wafer. Preferably, the diameter of the wafer transfer disk 12 is no more than about 10 mm smaller than the diameter of the device wafer, more preferably it is no more than about 5 mm smaller than the diameter of the device wafer, and even more preferably is no more than about 2 mm smaller than the diameter of the device wafer.

The thickness of the wafer transfer disk 12, as measured from the wafer-engaging surface 24 to the back surface 26, may be any thickness that will prevent the wafer transfer disk 12 from warping or bowing (e.g., due to thermal expansion/contraction) during device wafer transfer. Preferably, the wafer transfer disk 12 has a thickness of from about 1/32 of an inch to about 3/4 of an inch, more preferably from about 1/16 of an inch to about 1/2 inch, and even more preferably from about 1/8 of an inch to about 1/4 of an inch. The wafer transfer disk 12 may be made of any material or materials, provided that the wafer transfer disk 12 exhibits no significant warping, bowing, or thermal expansion/contraction during device wafer transfer. In other words, thermally-stable materials are particularly preferred. Exemplary, non-limiting materials include metals, polymers, ceramics, composites, glass, or any combination thereof, such as aluminum, Teflon® polymeric materials, polyether ether ketone (PEEK) polymeric materials, and the like.

In one or more embodiments, the wafer-engaging surface 24 of the wafer transfer disk 12 has non-stick properties, such as a low coefficient of friction, low surface energy, hydrophobicity, and the like, such that the device wafer is able to be moved freely over the wafer-engaging surface 24 of the wafer transfer disk 12. In one or more embodiments, the materials used to form the wafer-engaging surface 24 are inherently non-stick materials. In one or more embodiments, the wafer-engaging surface 24 can be rendered non-stick through physical surface treatments, such as polishing, and the like. The non-stick properties of the wafer-engaging surface 24 can also be achieved using coatings, films, layers, surface modifications, and the like of suitable materials, including fluoropolymers (i.e., Teflon®), such as polytetrafluoroethylene, fluorinated ethylene propylene copolymer, and perfluoroalkoxy, as well as release layers, such as fluorinated silanes, and siloxanes. Exemplary release materials are also described in U.S. Published Patent Application No. 2013/0201635, incorporated by reference herein. Such materials should be selected to be not just non-stick, but also thermally stable and non-reactive (e.g., chemically resistant) with the residual material on the device wafer.

Figure 4:
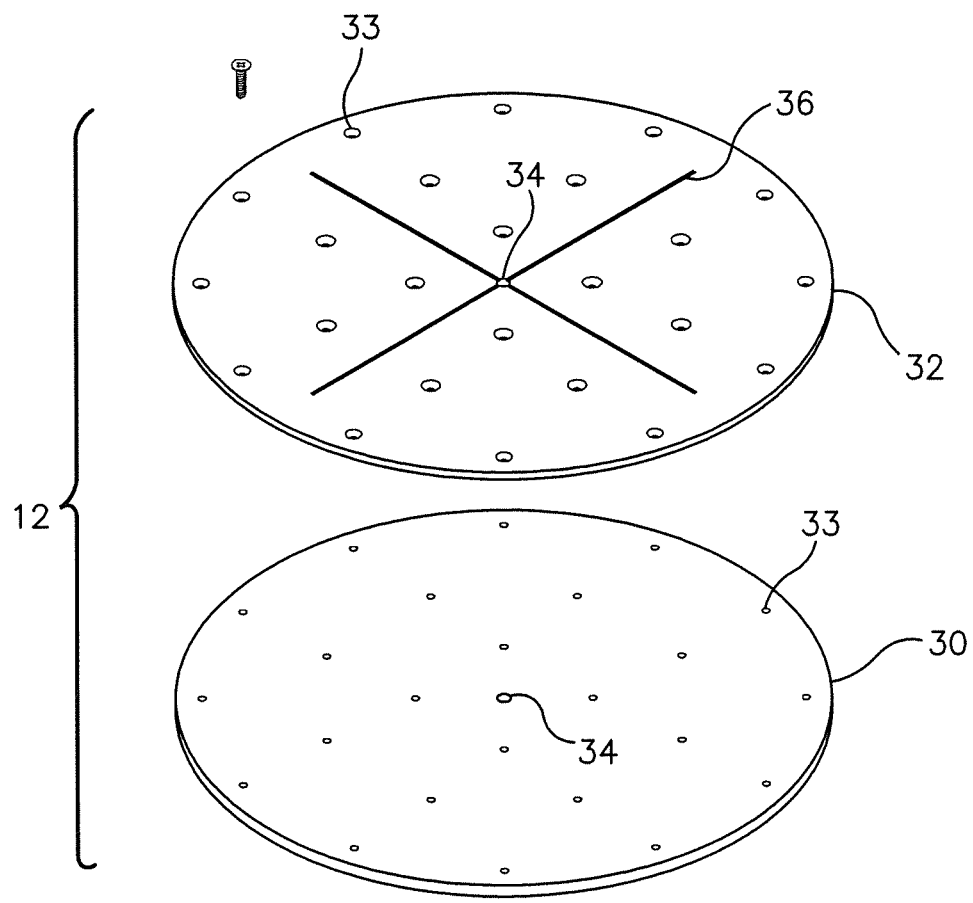
FIG. 4 is an exploded schematic of a two-piece embodiment of the wafer transfer disk.

The wafer transfer disk 12 may be a unitarily formed body, with a coating, film or layer of non-stick material to yield the wafer-engaging surface 24. The term "unitarily formed" as used herein is interchangeable with the term "integrally formed" and means that such unitarily formed piece is a monolithic body, and is not formed by attaching two or more initially separate parts to each other (regardless of how permanently), but is formed from a single piece of material. Alternatively, the wafer transfer disk 12 may be formed of two or more disks made of different materials, which are layered together to form the planar body 22 of the wafer transfer disk 12. For example, as shown in FIG. 4, the wafer transfer disk 12 can comprise a base disk 30 made of a suitable material for providing rigidity and structure and an upper disk 32 made of a suitable material for providing the non-stick properties. In one preferred embodiment, the wafer transfer disk is formed from a Teflon® PTFE disk on top of an aluminum disk. The base disk 30 and upper disk 32 can be secured together using any suitable technique, including adhesives, fasteners (screws, etc.), pins, and combinations thereof. For example, FIG. 4 illustrates screw holes 33 through the disks, where screws or pins would be inserted to secure the base disk 30 and upper disk 32 together.

In one or more embodiments, the wafer transfer disk 12 is configured to allow vacuum to be pulled on the device wafer through the disk body 22 when placed on a vacuum chuck. In particular, the body 22 may further comprise one or more holes or openings 34 extending through the body from the wafer-engaging surface 24 to the back surface 26. The body 22 may further comprise one or more elongated depressions or grooves 36 in the wafer-engaging surface 24, which extend from the one or more openings 34 to expand the vacuum pressure towards the periphery of the disk 12. For example, in the above embodiment comprising a Teflon® PTFE disk on top of an aluminum disk, both the Teflon® PTFE disk and aluminum disk will comprise aligned vacuum holes 34 therethrough, whereas vacuum grooves 36 are formed only in the wafer-engaging (top) surface of the Teflon® disk.

Figure 5:
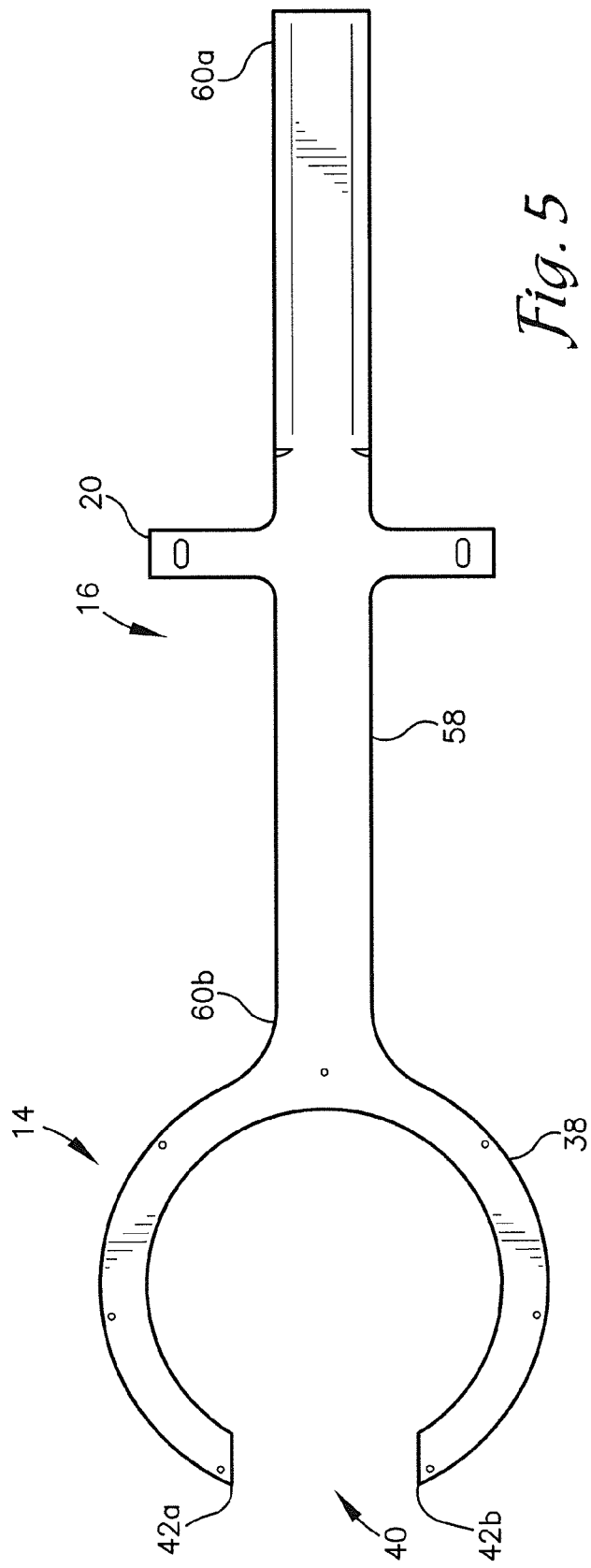
FIG. 5 is a top-down schematic drawing showing the end effector and elongated handle.
Figure 6:
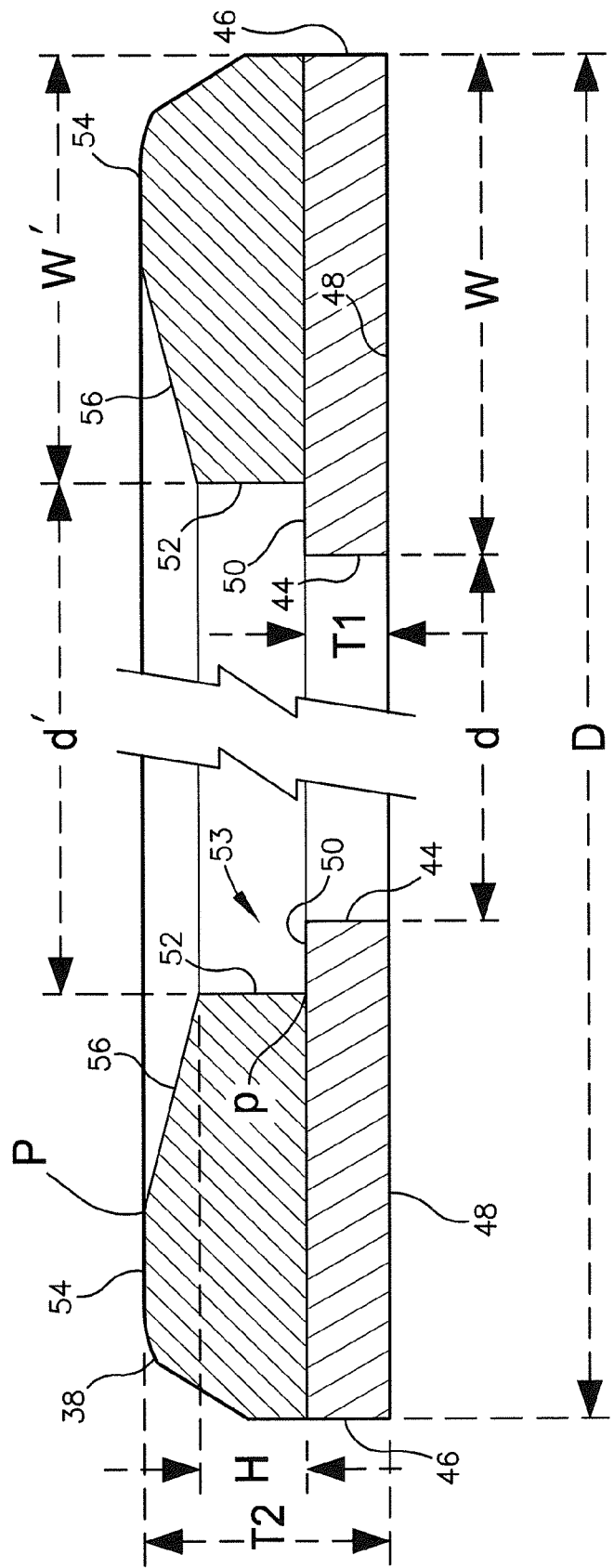
FIG. 6 is an enlarged cut-away cross-sectional of the end effector.

As depicted in FIG. 5, the end effector 14 is configured to at least partially receive the wafer transfer disk 12, and in particular holds the wafer transfer disk 12 during receiving of the device wafer, wafer transfer, and up to and until the device wafer and wafer transfer disk 12 are placed into the next tool for processing. Thus, although depicted herein in a substantially circular configuration, it will be appreciated that the end effector 14 could be of any shape (e.g., square, ellipsoid, etc.), but would typically correspond to the general shape of the device wafer 2 and/or wafer transfer disk 12. The end effector 14 comprises a discontinuous circular body 38 or perimeter defining a central opening 39, and more particularly is substantially C-shaped with a gap 40 at one location resulting in two free ends 42a, 42b. Referring to FIG. 6, the body 38 has an annular interior sidewall 44 and an opposing annular exterior sidewall 46. The body 38 has a bottom surface 48 extending between the interior sidewall 44 and exterior sidewall 46, and a disk-engaging surface 50 extending from the interior sidewall 44 outwardly in substantially parallel alignment with the bottom surface 48. The disk-engaging surface 50 does not extend all of the way to the exterior sidewall 46, but terminates at a point "p" that is spaced from the exterior sidewall 46. A disk-engaging sidewall 52 extends from point "p" substantially perpendicularly from the disk-engaging surface 50 in a direction away from bottom surface 48, such that the disk-engaging surface 50 and disk-engaging sidewall 52 cooperatively form a right (i.e., 90°) angle or disk-receiving groove 53. Accordingly, the disk-engaging sidewall 52 is parallel to and outwardly offset from the interior sidewall 44. The C-shaped body 38 further comprises a top surface 54 opposing the bottom surface 48 that extends inwardly from the exterior annular sidewall 46 in substantially parallel alignment with the bottom surface 48. The top surface 54 does not extend all of the way to the interior sidewall 44, but terminates at a point "P" that is spaced from the interior sidewall 44. The C-shaped body 38 comprises a beveled surface 56 that extends from termination point "P" of the top surface 54 and slopes downwardly to meet the disk-engaging sidewall 52.

The annular interior sidewall 44 defines the first inner diameter "d" of the C-shaped body 38, and the annular exterior sidewall 46 defines the outer diameter "D" of the C-shaped body 38. The first inner diameter "d" is sized to be smaller than the diameter of the wafer transfer disk 12, so that, in use, the wafer transfer disk 12 is received in the disk-receiving groove 53 such that at least the periphery of the backside surface 26 of the wafer transfer disk 12 contacts or rests on the disk-engaging surface 50 (preventing it from falling through), and the outer edge 28 of the water transfer disk 12 is adjacent the disk-engaging sidewall 52. This is illustrated in the embodiment in FIG. 7. It will be appreciated that virtually any size can be used, so long as it is smaller than the disk, but does not close off the central opening 39. In one or more embodiments, first inner diameter "d" will be from about 0.004 inches to about 2 inches smaller than the diameter of the wafer transfer disk 12, preferably from about 0.4 inches to about 1 inch smaller than the diameter of the wafer transfer disk 12. In the context of the C-shaped body 38, the "diameter" has the same understanding as if the C-shaped body 38 were a continuous circular body and did not include the gap. In other words, the "diameter" is the maximum surface-to-surface dimension as measured as a straight line from one side of the body to the other (e.g., a line extending between a point on the first inner sidewall to an opposite point on the first inner sidewall and passing through the center point of opening 39). The outer diameter "D" can be of any size, provided that it maintains sufficient rigidity of the end effector 14 during wafer transfer. In general, outer diameter "D" will range from about ½ inch to about 4 inches larger than the diameter of the wafer transfer disk, and preferably from about 1 inch to about 2 inches larger than the diameter of the wafer transfer disk 12.

Figure 7:
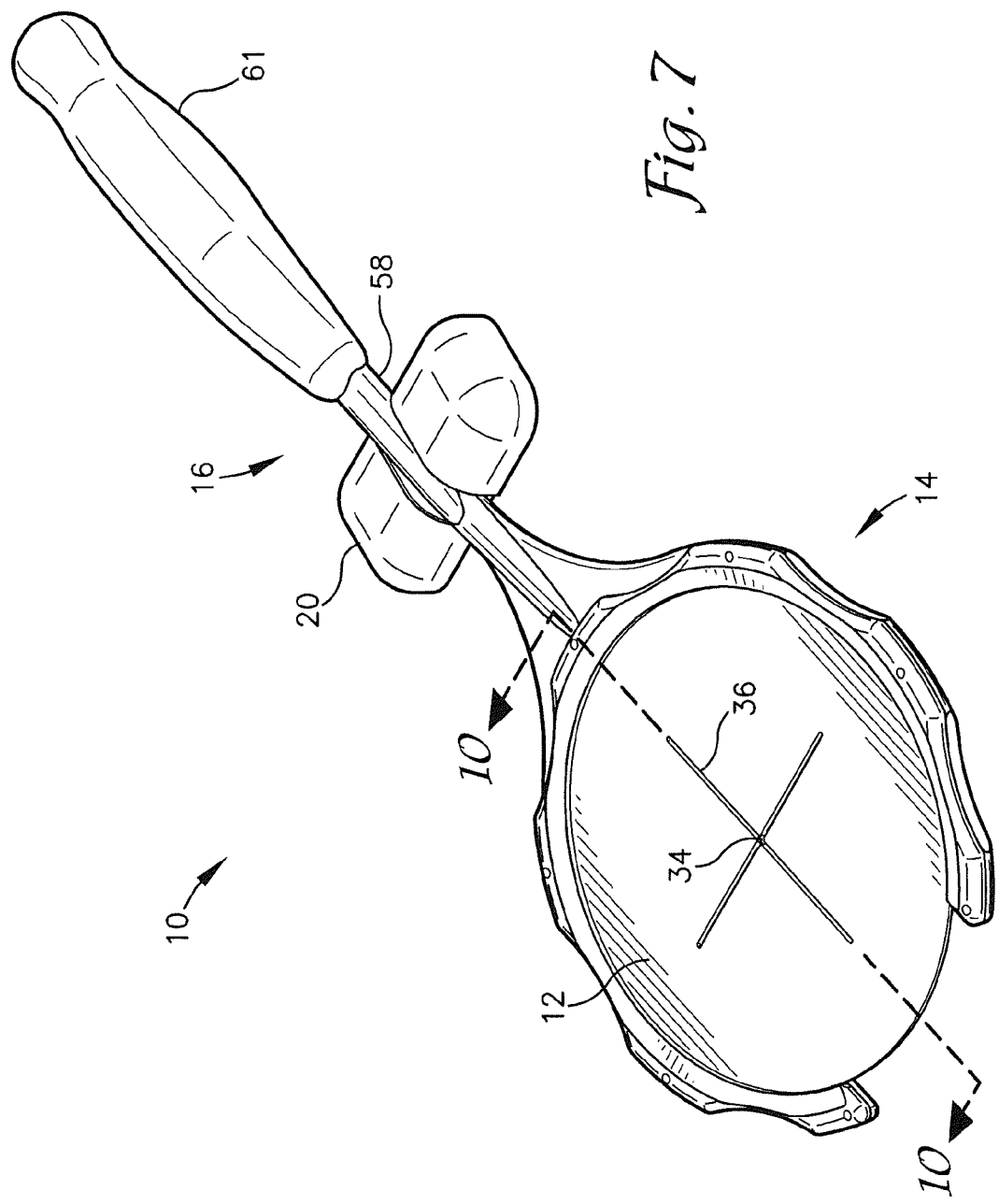
FIG. 7 is a schematic drawing of an alternative embodiment of the wafer transfer assembly.

The disk-engaging sidewall 52 defines the second inner diameter "d'" of the C-shaped body 38. The second inner diameter "d'" is sized to be slightly larger than the diameter of the wafer transfer disk 12, such that the wafer transfer disk 12 fits in opening 39 without any substantial friction between the edge 28 of the wafer transfer disk 12 and the disk-engaging sidewall 52. Likewise, second inner diameter "d'" is not so large that there is room for substantial shifting or movement of the wafer transfer disk 12 as it rests in the groove 53 of the C-shaped body 38, as shown in FIG. 7 (see also FIG. 8). In other words, wafer transfer disk 12 can be positioned in opening 39 by carefully dropping it into place, and can be removed by simply lifting it out of the opening 39 without more than minimal finger pressure. In general, second inner diameter "d'" will range from about 0 inches to about 0.012 inches larger than the diameter of the wafer transfer disk, and preferably from about 0.006 inches to about 0.008 inches larger than the diameter of the wafer transfer disk 12. The height "H" of the disk-engaging sidewall 52, as measured from the disk-engaging surface 50 to the beveled surface 56, will be at least the same size as the thickness of the wafer transfer disk 12, such that when the wafer transfer disk 12 is received in the disk-receiving groove 53, the wafer-engaging surface 24 is approximately flush with the top of the disk-engaging sidewall 52, and in any event does not extend beyond the top of the disk-engaging sidewall 52, as illustrated in FIG. 8. In general, the height "H" will range from about 1/32 inch to about 1 inch, preferably from about 1/16 inch to about 3/4 inch, and more preferably from about 3/8 inch to about 1/2 inch.

The width "W" of the C-shaped body as measured from the interior sidewall 44 to the exterior sidewall 46 will be sufficient to maintain rigidity of the end effector 14 during transfer. Preferably, the width "W" is from about 1/4 inch to about 4 inches, and more preferably from about 1/4 inch to about 2 inches. The width "W'" of the C-shaped body as measured from the disk-engaging sidewall 52 to the exterior sidewall 46 will range from about 1/4 inch to about 2 inches, and preferably from about 1/2 inch to about 1 inch. The thickness "T" of the end effector 14 will vary along its profile. In particular, the thickness "T1" as measured from the bottom surface 48 to the disk-engaging surface 50 will be from about 1/16 inch to about 1 inch, preferably from about 1/10 inch to about 1/2 inch, and more preferably from about 1/8 inch to about 1/4 inch. The thickness "T2" as measured from the bottom surface 48 to the top surface 54 will be from about 1/8 inch to about 2 inches, and preferably from about 1/4 inch to about 1 inch. Similarly, it will be appreciated that the thickness measured from the bottom surface 48 to the beveled surface 56 will gradually change along the angle of the bevel (measurement not shown).

In one or more embodiments, the end effector 14 is of a fixed configuration, in that the free ends 42a, 42b are neither movable away from one another (i.e., spread apart) nor able to be drawn toward one another (in contrast to a movable ring-clamp). Accordingly, the central opening 39 is of a fixed diameter, and the size of the gap 40 is also fixed. Referring back to FIG. 5, the size of the gap 40 should be wide enough that the gap can go around any wafer support device on a tool where the device wafer is being transferred from or to, such as spin chucks, vacuum chucks, lift pins, and the like. It will also depend on the overall size of the end effector 14. In general, the size of the gap 40, as measured by the distance between the free ends 42a, 42b, will range from about 1 inch to about 12 inches, preferably from about 2 inches to about 8 inches, and more preferably from about 3 inches to about 6 inches.

Figure 11:
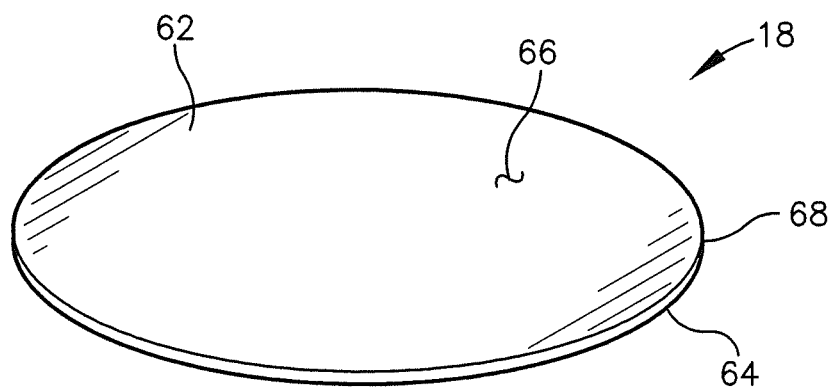
FIG. 11 is a schematic drawing of an optional top disk for use in the assembly.
Figure 9:
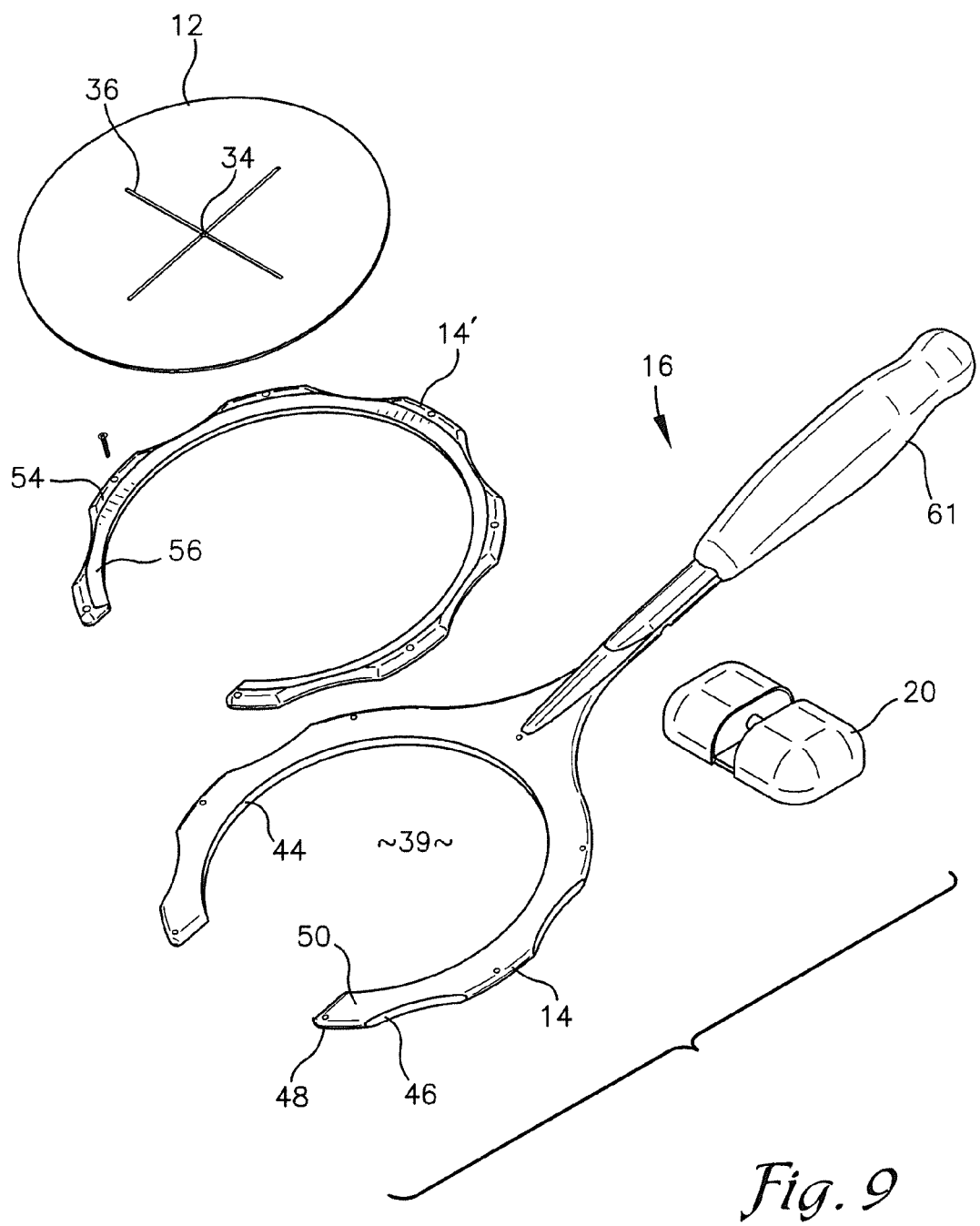
FIG. 9 is an exploded view of the dis-assembled pieces of the wafer transfer assembly.

The end effector 14 may be made of any material or materials, so long as it exhibits no significant warping, bowing, or thermal expansion/contraction during device wafer transfer. In other words, thermally-stable materials are particularly preferred. Exemplary, non-limiting materials include metals, polymers, ceramics, glass, and combinations thereof, such as aluminum, Teflon® polymeric materials, PEEK polymeric materials, and the like. Surfaces of the end effector 14 that may come into contact with the debonded device wafer preferably have non-stick properties, which can be achieved using inherently non-stick materials, physical surface treatments (e.g., polishing), or using coatings, films, surface modifications, release layers, and the like of suitable materials, including fluoropolymers, fluorinated silanes, siloxanes, and the like, as discussed above with respect to the non-stick surface of the transfer disk 12. In one or more embodiments, the C-shaped body 38 is a unitarily formed body with a coating, film or layer of non-stick material adjacent the top surface 54, beveled surface 56, and disk-engaging sidewall 52. In one or more embodiments, the C-shaped body 38 comprises two or more pieces secured together to yield the end effector 14, as illustrated in FIG. 9. For example, a rigid material (e.g., metal or composite) could be used to form the bottom surface 48, interior sidewall 44, the disk-engaging surface 50, and a lower portion of the exterior sidewall 46. A different material, such as a non-stick polymeric material can be positioned on top of the rigid material to form the disk-engaging sidewall 52, top surface 54, beveled surface 56, and an upper portion of the exterior sidewall 46. In particular, as illustrated in FIG. 9, the end effector comprises a base piece 14 and a C-shaped trim piece 14', instead of being unitarily formed. As such, the two pieces would be placed so that the respective exterior sidewalls are aligned to yield the exterior sidewall 46, and the disk-engaging sidewall 52 is offset from the interior sidewall 44 to form the disk-receiving groove 53. The two pieces can be secured together using any suitable technique, including adhesives, fasteners (screws, etc.), pins, and combinations thereof. The wafer transfer disk 12 rests on top of the base piece 14 and trim piece 14' once assembled. In one preferred embodiment, the C-shaped body 38 comprises a lower aluminum portion with a top portion made of Teflon® PTFE. In this embodiment, the inner diameter ("d") of the aluminum portion of the end effector 14 is slightly smaller than the inner diameter ("d'") of the PTFE portion of the end effector 14, allowing the wafer transfer disk 12 to rest directly on the aluminum portion and adjacent the interior annular sidewall of the PTFE portion, when received in the opening, as shown in FIG. 8. A cross-section view along section line 3 from FIG. 7 is depicted in FIG. 11.

Referring back to FIG. 5, the wafer transfer assembly 10 further comprises an elongated handle 16 extending from the end effector 14. In particular, the handle 16 comprises an elongated shaft 58 extending from the C-shaped body 38, with a proximal end 60a for grasping by a user or robot, and a distal end 60b at the point where the handle 16 makes contact the perimeter of the end effector 14 C-shaped body 38. Although depicted with the distal end 60b of the handle 16 positioned at a point on the perimeter of the C-shaped body 38 directly opposite from the gap 40, it will be appreciated that the location of the handle's extension from the C-shaped body 38 can be varied so long as it does not interfere with the gap 40. In one or more embodiments, the handle 16 is unitarily formed with the end effector 14. In one or more embodiments, the handle 16 is a separate piece that is attachable/detachable to/from the end effector 14 at the distal end 60b. The handle 16 may be of any material or materials capable of remaining rigid and not warping during wafer handling, including, but not limited to, metals, polymers, ceramics, glass, or combinations thereof, such as aluminum, stainless steel, Teflon® polymeric materials, PEEK polymeric materials, and the like.

In one or more embodiments, as shown in the version in FIG. 7, the handle 16 may further comprise a grip 61 at the proximal end 60a for ease and comfort of grasping. Regardless, the handle shaft 58 should be of a length that is sufficient to allow it to reach and extend the end effector 14 into the necessary parts of a wafer processing tool and to allow safe handling of the wafer. For example, in the case of manual use, the handle 16 length should permit a user to reach areas such as vacuum chucks and lift pins, while keeping his hands away from dangerous points on a wafer processing tool such as hot plates or pinch points. Preferably, the handle 16 has a length, as measured from the proximal end 60a to the distal end 60b, of from about 3 inches to about 24 inches, and more preferably from about 6 inches to about 16 inches. The width of the handle shaft 58 can vary, but should be wide enough to allow the handle 16 to remain rigid during wafer handling, preferably from about 1/2 inch to about 6 inches, more preferably from about 1 inch to about 3 inches wide. The thickness of the handle shaft 58 can also vary, but should be thick enough to allow the handle 16 to remain rigid during wafer handling, preferably from about ⅛ inch to about 2 inches thick, more preferably about ¼ inch to about 1 inch thick, most preferably about ½ inch thick.

Referring to either FIG. 5 or FIG. 7, in one or more embodiments, the wafer transfer assembly 10 may further comprise an optional alignment indicator 20. The alignment indicator 20 is used to facilitate positioning of the wafer transfer assembly 10, and particularly the end effector 14 in proximity to the wafer processing tools. This ensures that the device wafer will be positioned for correct placement with respect to either the wafer transfer assembly 10 (e.g., for catching the debonded device wafer as it falls from the wafer debonding tool) or a wafer processing tool (e.g., for insertion of the debonded device wafer into a subsequent tool). In other words, the alignment indicator 20 facilitates consistent and repeatable positioning of the assembly 10 during transfer of the debonded wafer between processing tools. In one or more embodiments, the alignment indicator 20 is located on the handle shaft 58 of the assembly 10. In one or more embodiments, the alignment indicator 20 is a transverse member positioned across the elongated shaft 58 at a designated location between the proximal 60*a* and distal 60*b* ends, as depicted in FIG. 5. In this embodiment, the alignment indicator 20 forms a cross or T-shape with the handle shaft 58. In one or more embodiments, the transverse member can be unitarily formed with the handle shaft 58. In one or more embodiments, the transverse member is a separate piece that is attached to the handle shaft 58 using adhesive, fasteners, pins, and combinations thereof, as illustrated in FIG. 8. In one or more embodiments, the alignment indicator 20 may also simply be a notch, line, or other marking at the designated location on the elongated shaft 58 to indicate the placement location of the assembly relative to the processing tool (not shown). It will be appreciated that more than one alignment indicator 20 could be included in the assembly, optionally with each indicator placement designated for a respective processing tool. In one or more embodiments, the alignment indicator 20 is configured to mate or engage with corresponding structures on the wafer processing tools so that the wafer transfer assembly can be correctly positioned with respect to the tool. For example, the alignment indicator 20 can mate against the front structure of a Cee® 1300DB or 1300CSX slide debonder in order to ensure that the device wafer being removed from the slide debonder is centered on the wafer transfer disk 12 in the end effector 14 when the debonded device wafer falls from the slide debonder.

Referring to FIG. 11, in one or more embodiments, the wafer transfer assembly 10 may further comprise an optional top disk 18. In particular, when transferring thinned device wafers, there is the potential for the debonded wafer to bow or warp because of temperature variations between tools. When present, the top disk 18 can be placed on top of the device wafer during transfer to keep the device wafer from warping or bowing during transfer. The top disk 18 comprises a substantially planar body 62, including a wafer-engaging surface 64, an opposing top surface 66, and an outer edge 68 defining the perimeter of the top disk 18. The top disk 18 can be of any shape, although it would typically correspond to the shape of the device wafer 2 and/or transfer disk 12. In one or more embodiments, the top disk 18 is substantially circular in shape, and may optionally have at least one flat or notch (straight edge at the periphery, not shown). In one or more embodiments, the top disk 18 should be about the same diameter as the wafer transfer disk 12 and/or debonded device wafer, such that when stacked, the wafer transfer disk 12 and top disk 18 sandwich the debonded wafer therebetween, with the outer edges of each disk (28 and 68, respectively) aligned. Depending on the application, the diameter of the top disk 18 may also be smaller or larger than the diameter of the debonded device wafer and/or the diameter of the wafer transfer disk 12. In some embodiments, the top disk 18 may also mate with the debonded device wafer or wafer transfer disk 12 in order to hold the top disk 18 in place relative to the rest of the stack during transfer. Such embodiments include using recessed cut outs, nesting, or locking configurations. The top disk 18 may be made of any material or materials, provided that the top disk 18 exhibits no significant warping, bowing, or thermal expansion/contraction during device wafer transfer. In other words, thermally-stable materials are particularly preferred. Exemplary, non-limiting materials include metals, polymers, ceramics, composites, glass, or any combination thereof, such as aluminum, Teflon® polymeric materials, PEEK polymeric materials, and the like. In one or more embodiments, the wafer-engaging surface 64 of the top disk 18 has non-stick properties, as discussed above with respect to the wafer transfer disk 12. The top disk 18 may be a unitarily formed body, with a coating, film or layer of non-stick material to yield the wafer-engaging surface 64. Alternatively, the top disk 18 may be formed of two or more disks made of different materials, which are layered together to form the planar body 62 of the top disk 18. The top disk 18 may be any thickness that will allow the disk not to warp or bow during device wafer transfer. Preferably, the disk should be from about ¹⁄₁₆ inch thick to about 4 inches thick, more preferably from about ⅛ inch to about 1 inch thick, even more preferably from about ¼ inch to about ½ inch thick.

Regardless of the embodiment, the wafer transfer assembly 10 is used by first placing the wafer transfer disk 12 into the end effector 14. Advantageously, the beveled surface 56 facilitates the wafer transfer disk 12 automatically centering and passively falling into opening 39 when dropped into the end effector 14. Likewise, the gap 40 in conjunction with opening 39 facilitates lifting out the wafer transfer disk 12 by gently pressing upwards on the back surface 26 of the wafer transfer disk 12 for removal from the end effector 14.

Figure 14:
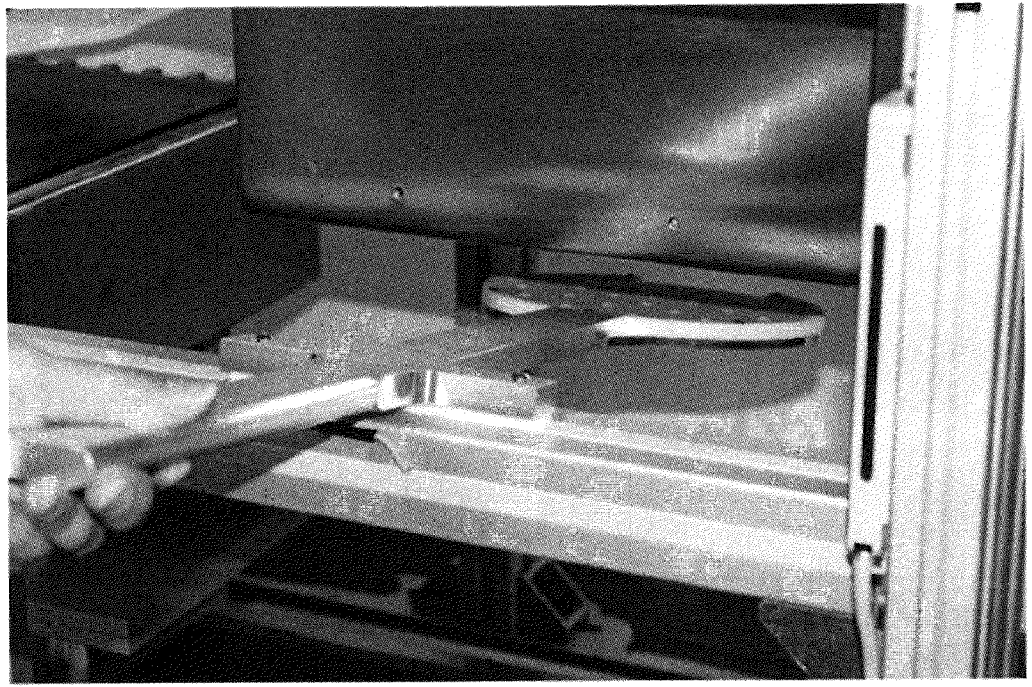
FIG. 14 is a photograph from the working example showing placement of the assembly into the debonder using the alignment indicator.

The wafer transfer assembly is aligned with a wafer processing tool so that the end effector and wafer transfer disk are positioned under the device wafer in the wafer processing tool to receive the device wafer after processing (see FIG. 14). In more detail, the device wafer (temporarily bonded to a carrier substrate) is processed on a first wafer processing tool. The processed device wafer is then separated from the carrier substrate for further processing. Preferably, the device wafer is separated from the carrier substrate using slide debonding. In this process, the temporarily mounted device wafer and carrier substrate stack is placed into a debonding tool with the device (often thinned) wafer on top. In some embodiments, the stack is heated to soften the bonding material. The bonded substrates are then slid apart at a temperature, pressure, and speed suitable to allow the temporary bonding material to release the substrates and allow them to be slid apart. During this process, vacuum is applied to both the device wafer and the carrier substrate, so that after the two are slid apart, the device wafer is suspended from the top platen of the debonder with its device side down. Vacuum is turned off to the top platen, which causes the device wafer to fall onto the wafer transfer disk in the end effector.

Regardless of the embodiment, the debonded device wafer is released by the processing tool and lands on the wafer transfer disk in the end effector to yield the transfer stack 70 (FIG. 12, see also FIG. 15), with the device surface adjacent the wafer-engaging surface of the wafer transfer disk. Optionally, the alignment indicator may be used to ensure that the wafer transfer disk is directly under the debonded device wafer when released from the tool. When the device wafer lands on the wafer transfer disk, with the device surface adjacent the wafer-engaging surface, a low bonding strength interface is created because the residual materials on the device surface of the device wafer cannot strongly adhere to the non-stick wafer-engaging surface of the wafer transfer disk. As noted above, the residual material on the device surface of the device wafer may be slightly tacky or sticky after debonding. In one or more embodiments, there will be an initial minimal level of adhesion between the device surface and the wafer-engaging surface, which advantageously helps stabilize the device wafer on the wafer transfer disk. Once the residual material cools and/or hardens, its tackiness is reduced and there will be a low bonding interface with the non-stick surface of the wafer-engaging surface. This will facilitate ultimate separation of the device wafer from the wafer transfer disk using minimal force (e.g., slight finger pressure) without damaging the device.

Figure 12:
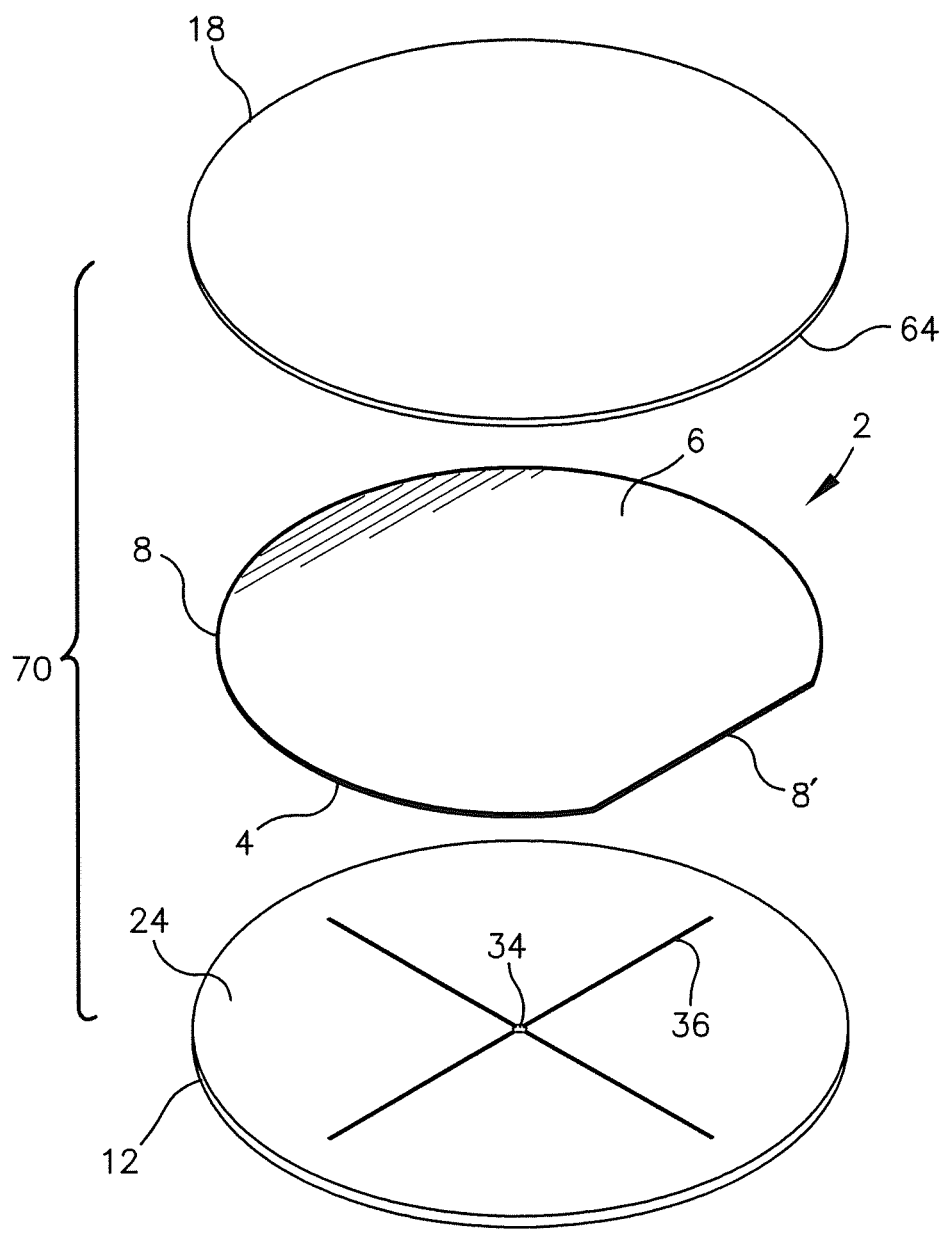
FIG. 12 is an exploded view of the transfer stack, including the optional top disk.

The assembly, carrying the debonded device wafer, is removed from the processing tool, and an optional top disk can be placed on top of the device wafer, with the wafer-engaging surface adjacent the backside surface of the debonded device wafer. As shown in FIG. 12, the wafer transfer disk 12, device wafer 2, and optional top disk 18 yield the transfer stack 70. The optional top disk 18 may help prevent warping and bowing of the debonded device wafer during transfer. This top disk 18 also weighs down the device wafer 2 to keep it securely in place during transfer. If the device wafer 2 does not have a tendency to warp or bow, the top disk 18 may be omitted.

The debonded device wafer can then be transferred to a second wafer processing tool. This can be done by transferring the entire assembly 10 and transfer stack 70 to the second processing tool, using the handle and end effector to position the transfer stack into the second tool. Alternatively, the transfer stack 70 can be removed from the end effector 14 and separately transferred to the second processing tool without use of the end effector 14 (i.e., by directly carrying the stack 70). In any event, the transfer stack 70 is placed into the second wafer processing tool. In one or more embodiments, vacuum is pulled on the wafer transfer disk and device wafer in the second processing tool, followed by removing the top disk, when present. The wafer transfer disk can be used to support the device wafer during subsequent processing, or it can be separated from the device wafer.

In one or more embodiments, specialized chucks may be created for the second wafer processing tool to allow it to receive the assembly. If the second wafer processing tool uses a vacuum chuck and the wafer transfer disk is equipped with vacuum holes and vacuum grooves, the entire assembly can be placed onto the vacuum chuck and vacuum pulled on the device wafer through the wafer transfer disk. Once the wafer transfer disk and device wafer are secured in place in the second wafer processing tool, the optional top disk can be removed, since the likelihood of wafer bow and warpage is minimized once vacuum is applied. The second wafer processing tool can then be used normally to perform the next processing steps on the device wafer. Examples of subsequent processing include lamination (as illustrated in the working example), cleaning, inspection, testing, transport, and combinations thereof.

In one embodiment, the inventive wafer transfer assembly can be used to transfer a device semiconductor wafer from a Cee® 1300DB or 1300 CSX thermal slide debonder to a laminating station. In this case, the device wafer is separated from its carrier using the Cee® 1300DB or 1300CSX thermal slide debonder. The wafer transfer assembly is inserted into the debonder so that the wafer transfer disk is positioned under the device wafer. The vacuum is turned off to the upper platen, allowing the debonded device wafer to drop onto the wafer transfer disk. The wafer transfer tool is then removed from the debonder, and the top disk is placed on top of the device wafer. The transfer stack is then removed from the end effector and separately carried to an Ultron Systems UH114 Series laminator. The transfer stack is then placed into a customized vacuum chuck in the laminator, and vacuum is pulled on the device wafer through the wafer transfer disk. The top disk is then removed, if present, and the device wafer is laminated to a film frame using the normal laminating process. The laminated device wafer is then separated by simply lifting away from the wafer transfer disk.

In an alternative embodiment, the device wafer can be debonded directly onto the wafer transfer disk. In this embodiment, the wafer transfer disk is first placed into the processing tool (e.g., debonder) with the back surface adjacent the chuck. The temporary bonded stack is then placed onto the wafer transfer disk in the tool. Vacuum is applied to the carrier substrate. Vacuum is also pulled on the device wafer through the vacuum holes and grooves of the wafer transfer disk, so that after the device and carrier are slid apart, the device wafer is supported on top of the wafer transfer disk with its backside surface adjacent the wafer-engaging surface of the wafer transfer disk. Vacuum is turned off and the wafer transfer disk can then be used to support the debonded device wafer to another processing tool. In one or more embodiments, this alternative wafer transfer stack (e.g., wafer transfer disk and device wafer) can be removed from the tool using the end effector and handle. In one or more embodiments, the wafer transfer stack can be removed from the tool via direct handling of the wafer transfer disk.

In another embodiment, the handle and end effector may be used with or without the wafer transfer disk to place a wafer or bonded wafer stack into a tool, such as a debonder. In this embodiment, the wafer or bonded wafer stack is supported on the wafer transfer disk, or received in the end effector in the same manner as the wafer transfer disk described above. The handle and end effector can then be positioned in a wafer processing tool and used to lower the wafer or bonded stack into place.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Use of Wafer Transfer Assembly to Transfer a Silicon Wafer

Figure 15:
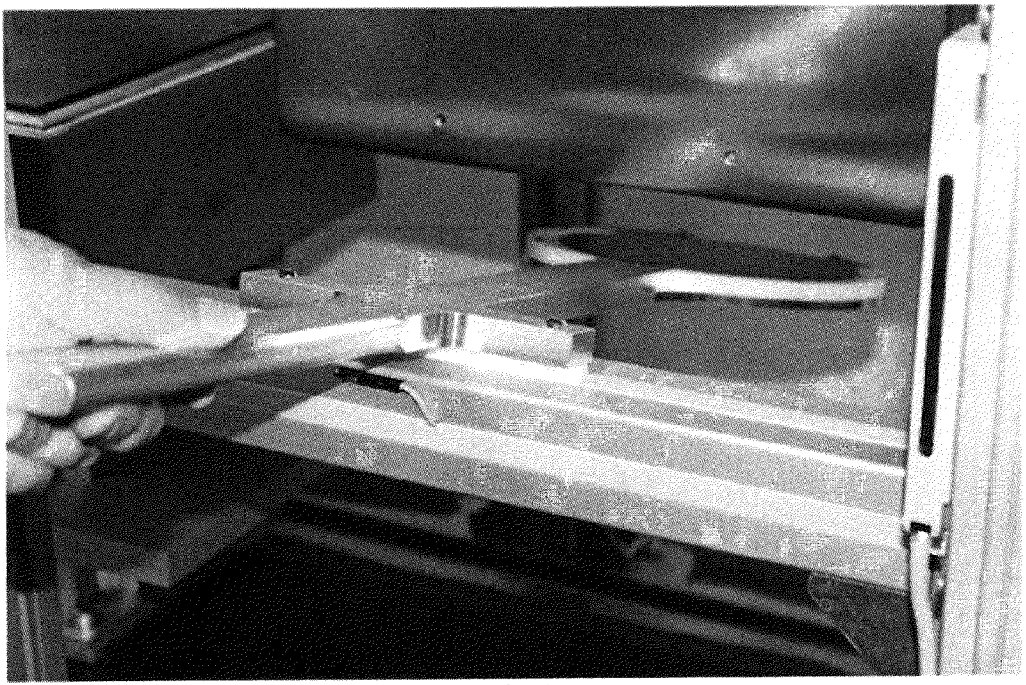
FIG. 15 is a photograph from the working example showing the debonded wafer landing on the transfer disk.
Figure 16:
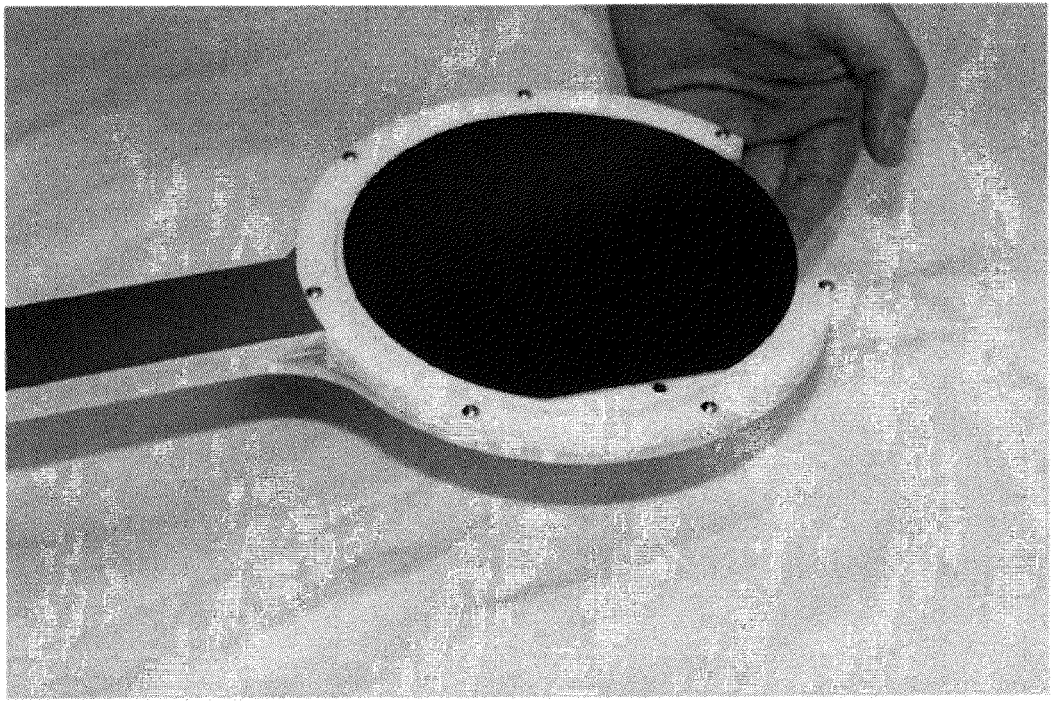
FIG. 16 is a photograph from the working example showing the wafer transfer assembly and debonded wafer removed from the processing tool.
Figure 17:
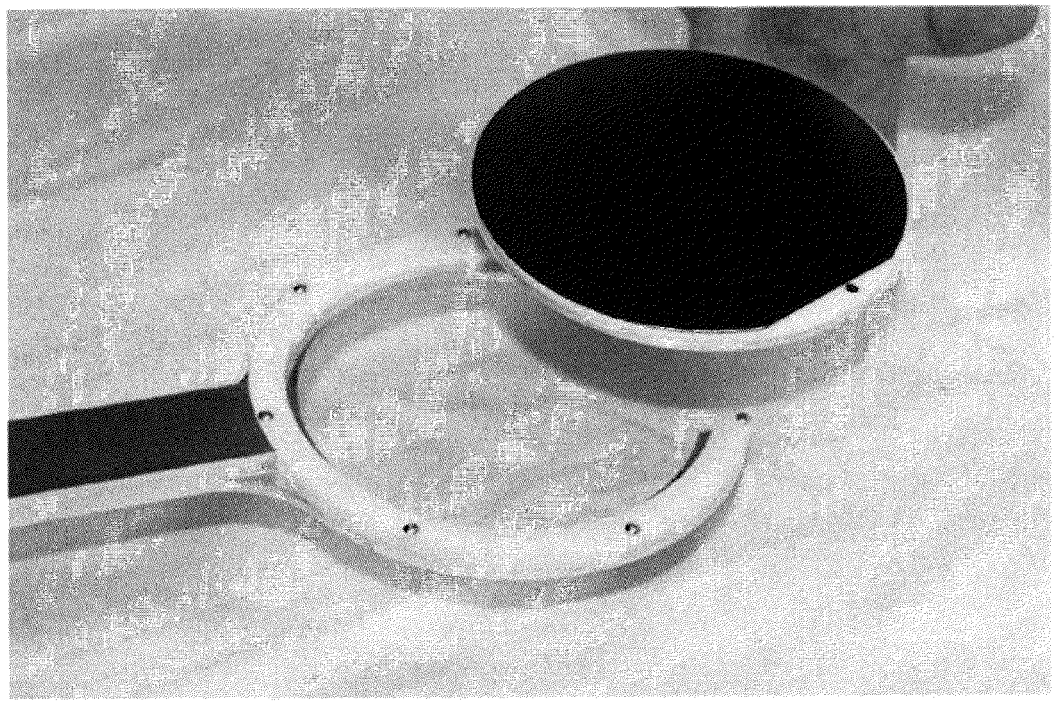
FIG. 17 is a photograph from the working example showing removal of the transfer stack from the end effector.
Figure 19:
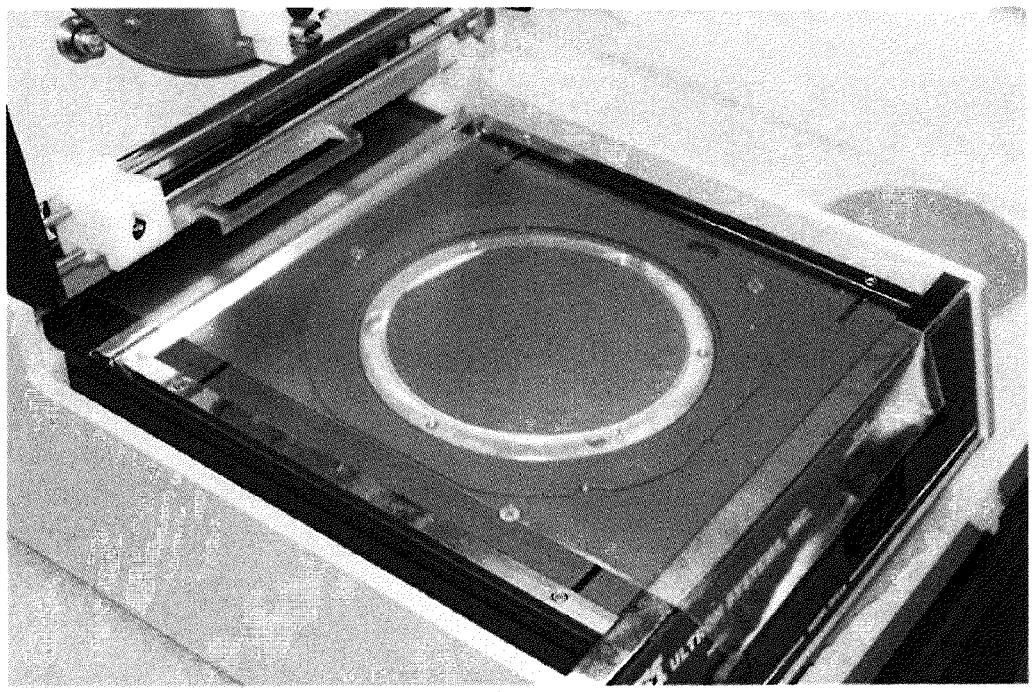
FIG. 19 is a photograph from the working example showing lamination of the device wafer.
Figure 20:
FIG. 20 is a photograph from the working example showing removal of the laminated device wafer by lifting away from the transfer disk on the chuck.

Two silicon wafers were bonded together using Brewer Science® WaferBOND® HT-10.10 material. The bonded stack was placed into a Cee® 1300DB thermal slide debonder and debonded, leaving the top (simulated device) silicon wafer suspended from the top platen by vacuum. A wafer transfer assembly as shown in FIG. 13(A)-(B) was used to transfer the wafer after debonding. As shown in FIG. 14, the wafer transfer assembly was inserted into the debonder so that the wafer transfer disk was positioned under the device wafer. The alignment indicator was positioned on the front structure of the debonder to ensure that the wafer transfer disk was centered underneath the device wafer. The vacuum was turned off to the upper platen, allowing the silicon wafer to drop onto the wafer transfer puck, as shown in FIG. 15. The wafer transfer tool was then removed from the debonder, as shown in FIG. 16. The wafer and disk stack was then removed from the end effector, as shown in FIG. 17, and carried to an Ultron Systems UH114 Series laminator. The stack was then placed into a customized vacuum chuck in the laminator, as shown in FIGS. 18(A)-(B), and vacuum was pulled on the device wafer through the wafer transfer disk. The device wafer was laminated to a film frame using the normal laminating process, as shown in FIG. 19. After the thinned wafer was laminated, vacuum was turned off and the film frame with the thinned wafer was removed simply by lifting it away from the transfer disk, as shown in FIG. 20. The transfer disk was then removed from the laminator chuck, as shown in FIG. 21(A)-(B).

What is claimed:

1. A method of transferring a device wafer in a manufacturing process comprising:
   providing a wafer transfer assembly comprising
      a wafer transfer disk, said wafer transfer disk being a substantially planar body comprising a wafer-engaging surface, an opposing back surface, and an outer edge defining the perimeter of said wafer transfer disk, said wafer-engaging surface having non-stick properties,
      an end effector configured to receive and support said wafer transfer disk, and
      an elongated handle extending from said end effector;
   providing a debonded device wafer, said device wafer comprising a device surface and a backside surface;
   said debonded device wafer being placed on said wafer transfer assembly with said device surface adjacent said wafer-engaging surface of said wafer transfer disk to yield a transfer stack, wherein said device surface has a low bonding strength interface with said wafer-engaging surface; and
   separating said debonded device wafer and said wafer transfer disk.

2. The method of claim 1, wherein said wafer-engaging surface is formed of a non-stick material, is a polished surface, or comprises a coating, film, or layer of polytetrafluoroethylene, fluorinated ethylene propylene copolymer, perfluoroalkoxy, fluorinated silane, or siloxane so as to yield said non-stick properties.

3. The method of claim 1, wherein said device surface comprises a residual coating of protective, adhesive, and/or fill material adjacent at least a portion of said device surface, said residual coating having an initial level of adhesion to said wafer-engaging surface, said method further comprising cooling said residual coating prior to said separating, wherein said cooled residual coating has a final level of adhesion to said wafer-engaging surface, said final level of adhesion being less than said initial level of adhesion.

4. The method of claim 1, wherein providing a debonded device wafer comprises:
   providing a temporary wafer stack comprising a device wafer temporarily bonded to a carrier substrate;
   processing said device wafer on a first wafer processing tool; and
   separating said processed device wafer from said carrier substrate to yield said debonded device wafer.

5. The method of claim 4, said debonded device wafer being released by said first wafer processing tool and landing on said wafer transfer disk.

6. The method of claim 5, said wafer transfer assembly further comprising an alignment indicator, said wafer transfer assembly being positioned under said first wafer processing tool so that said wafer transfer disk is centered under said device wafer using said alignment indicator.

7. The method of claim 4, wherein said processing is backside processing selected from the group consisting of backgrinding, TSV-formation processes, chemical-mechanical polishing, patterning, etching, metal and dielectric deposition, passivation, annealing, cleaning, and combinations thereof.

8. The method of claim 1, wherein said separating comprises slide debonding.

9. The method of claim 1, wherein said debonded device wafer is a thinned wafer having an average thickness of less than about 500 μm.

10. The method of claim 1, further comprising transferring said transfer stack to a second wafer processing tool and processing said debonded device wafer prior to separating said debonded device wafer and said wafer transfer disk.

11. The method of claim 10, wherein said transferring comprises removing said transfer stack from said end effector and placing said transfer stack in said second wafer processing tool.

12. The method of claim 11, wherein said wafer transfer disk further comprises one or more openings extending through the disk body from the wafer-engaging surface to the back surface, said method further comprising securing said transfer stack to said second wafer processing tool using vacuum pressure.

13. The method of claim 10, wherein said second processing is selected from the group consisting of lamination, cleaning, inspection, testing, transport, and combinations thereof.

14. The method of claim 10, further comprising placing a top disk on said backside surface of said debonded device wafer prior to transferring said transfer stack to said second wafer processing tool.

15. The method of claim 14, further comprising removing said top disk from said transfer stack and processing said debonded device wafer on said second wafer processing tool.

16. The combination of:
a wafer transfer assembly comprising
   a wafer transfer disk, said wafer transfer disk being a substantially planar body comprising a wafer-engaging surface, an opposing back surface, and an outer edge defining the perimeter of said wafer transfer disk, said wafer-engaging surface having non-stick properties,
   an end effector configured to receive and support said wafer transfer disk, and
   an elongated handle extending from said end effector; and
a debonded device wafer, said device wafer comprising a device surface and a backside surface, said device surface being adjacent said wafer-engaging surface of said wafer transfer disk, wherein said device surface has a low bonding strength interface with said wafer-engaging surface.

17. The combination of claim 16, wherein said debonded device wafer is a thinned wafer having an average thickness of less than about 500 µm.

18. The combination of claim 16, wherein said debonded device wafer is a microelectronic substrate selected from the group consisting of silicon, SiGe, SiO2, Si3N4, aluminum, tungsten, tungsten silicide, gallium arsenide, germanium, tantalum, tantalum nitride, indium, indium phosphide, and combinations thereof.

19. The combination of claim 16, further comprising a top disk adjacent said backside surface of said debonded device wafer.

20. A wafer transfer assembly comprising:
a wafer transfer disk, said wafer transfer disk being a substantially planar body comprising a wafer-engaging surface, an opposing back surface, and an outer edge defining the perimeter of said wafer transfer disk, said wafer-engaging surface having non-stick properties,
an end effector configured to receive and support said wafer transfer disk, said end effector comprising a C-shaped body with a gap at one location resulting in two free ends, said body comprising:
   an annular interior sidewall,
   an opposing annular exterior sidewall,
   a bottom surface extending between said interior sidewall and exterior sidewall,
   a disk-engaging surface extending from said interior sidewall outwardly in substantially parallel alignment with said bottom surface, and terminating at a point that is spaced from said exterior sidewall;
   a disk-engaging sidewall extending from said point substantially perpendicularly from said disk-engaging surface in a direction away from bottom surface,
   wherein said disk-engaging surface and disk-engaging sidewall cooperatively form a disk-receiving groove; and
an elongated handle extending from said end effector.

21. The wafer transfer assembly of claim 20, wherein said C-shaped body further comprises:
a top surface opposing said bottom surface and extending inwardly from said exterior annular sidewall in substantially parallel alignment with said bottom surface and terminating at a second point that is spaced from said interior sidewall; and
a beveled surface that extends from said second point and slopes downwardly to meet said disk-engaging sidewall.

22. The wafer transfer assembly of claim 20, wherein said handle comprises an elongated shaft having proximal and distal ends, said assembly further comprising an alignment indicator on said shaft.

23. The wafer transfer assembly of claim 22, wherein said alignment indicator is a transverse member positioned across said elongated shaft at a designated location between said proximal and distal ends.

24. The wafer transfer assembly of claim 23, wherein said alignment indicator is configured to mate with a corresponding structure on a wafer processing tool.

* * * * *